(12) United States Patent
Wang et al.

(10) Patent No.: US 10,972,219 B2
(45) Date of Patent: Apr. 6, 2021

(54) LDPC INTERLEAVER DESIGN FOR IMPROVED ERROR FLOOR PERFORMANCE

(71) Applicant: QUALCOMM Incorporated, San Diego, CA (US)

(72) Inventors: Ying Wang, San Diego, CA (US); Jing Jiang, San Diego, CA (US); Gabi Sarkis, San Diego, CA (US); Joseph Binamira Soriaga, San Diego, CA (US); Jing Lei, San Diego, CA (US); Seyong Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/576,338

(22) Filed: Sep. 19, 2019

(65) Prior Publication Data
US 2020/0099472 A1    Mar. 26, 2020

Related U.S. Application Data

(60) Provisional application No. 62/735,738, filed on Sep. 24, 2018.

(51) Int. Cl.
*H04L 27/36* (2006.01)
*H04L 1/00* (2006.01)

(52) U.S. Cl.
CPC .......... *H04L 1/0071* (2013.01); *H04L 1/0041* (2013.01); *H04L 1/0045* (2013.01);
(Continued)

(58) Field of Classification Search
CPC ..... H04L 1/0071; H04L 27/36; H04L 1/0057; H04L 1/0045; H04L 1/0068; H04L 1/0041
(Continued)

(56) References Cited

U.S. PATENT DOCUMENTS

| 10,277,439 | B2* | 4/2019 | Sun ...................... H04L 1/0071 |
| 2006/0156199 | A1* | 7/2006 | Palanki ............. H03M 13/2789 714/776 |

(Continued)

OTHER PUBLICATIONS

International Search Report and Written Opinion—PCT/US2019/052077—ISA/EPO—dated Dec. 10, 2019.
(Continued)

*Primary Examiner* — Don N Vo
(74) *Attorney, Agent, or Firm* — Patterson & Sheridan, L.L.P.

(57) ABSTRACT

Certain aspects of the present disclosure provide techniques and apparatus for low density parity check (LDPC) interleaving with improved error floor performance. A method for wireless communications that may be provided by a transmitting device is provided. The method generally includes encoding one or more information bits using a LDPC code to produce a coded bit sequence comprising systematic bits and parity bits. The transmitting device stores the coded bit sequence in a circular buffer. The transmitting device performs rate matching on the coded bit sequence. The rate matching includes interleaving the parity bits with a partial interleaver and interleaving the systematic bits and interleaved parity bits with a systematic bit priority mapping (SBPM) interleaver. The transmitting device maps the SBPM interleaved bit sequence to constellation points according to a modulation scheme and transmits the modulated bit sequence.

25 Claims, 29 Drawing Sheets

(52) U.S. Cl.
CPC .......... *H04L 1/0057* (2013.01); *H04L 1/0068* (2013.01); *H04L 27/36* (2013.01)

(58) Field of Classification Search
USPC ........................................ 375/298, 340, 341
See application file for complete search history.

(56) References Cited

U.S. PATENT DOCUMENTS

| | | | | |
|---|---|---|---|---|
| 2009/0147724 | A1* | 6/2009 | Nimbalker | H04L 1/1874 370/315 |
| 2010/0205511 | A1* | 8/2010 | Murakami | H03M 13/1154 714/781 |
| 2011/0066913 | A1* | 3/2011 | Kang | H03M 13/2957 714/752 |
| 2018/0019900 | A1* | 1/2018 | Sun | H04L 1/0071 |
| 2018/0152205 | A1* | 5/2018 | Kim | H03M 13/2792 |
| 2018/0212628 | A1 | 7/2018 | Chen et al. | |
| 2019/0052290 | A1* | 2/2019 | Andersson | H03M 13/6362 |

OTHER PUBLICATIONS

LG Electronics: "Discussion on Interleaving for eMBB Data", 3GPP Tsg Ran WG1 Meeting #89, 3GPP Draft; R1-1707671_Discussion on Interleaving for EMBB Data_Final, 3rd Generation Partnership Project (3GPP), Mobile Competence-Centre; 650, Route Des Lucioles; F-06921 Sophia-Antipolis Cedex; vol. Ran WG1, No. Hangzhou, China; May 15, 2017-May 19, 2019, May 14, 2017 (May 14, 2017), 4 Pages, XP051272878, Retrieved from the Internet: URL: http://www.3gpp.org/ftp/Meetings_3GPP_Sync/RAN1/Docs/ [retrieved on May 14, 2017] abstract, pp. 1,3,5.

Mediatek Inc: "On Design of Bit-Level Interleaver", 3GPP TSG-RAN WG1 Meeting #AH NR, 3GPP Draft; R1-1713710_On Design of Bit_Level Interleaver V3_Final, 3rd Generation Partnership Project (3GPP), Mobile Competence Centre; 650, Route Des Lucioles; F-06921 Sophia-Antipolis Cedex; France, vol. RAN WG1, No. Prague, Czech; Aug. 21, 2017-Aug. 25, 2017, Aug. 20, 2017 (Aug. 20, 2017), pp. 1-5, XP051316509, Retrieved from the Internet: URL: http://www.3gpp.org/ftp/Meetings_3GPP_SYNC/RAN1/Docs/ [retrieved on Aug. 20, 2017] the whole document.

Motorola: "Enhancement of IR for HSDPA", TSG-RAN Working Group 1#24, 3GPP Draft; R1-02-0285, 3rd Generation Partnership Project (3GPP), Mobile Competence Centre; 650, Route Des Lucioles; F-06921 Sophia-Antipolis Cedex; France, vol. RAN WG1, No. Orlando, USA; Feb. 18, 2002, Feb. 18, 2002 (Feb. 18, 2002), 10 pages, XP050095865, [retrieved on Feb. 18, 2002] the whole document.

Motorola: "Revised: Hybrid-ARQ Scheme Using Incremental Redundancy", TSG-RAN 1 #22, 3GPP Draft; R1-01-1244, 3rd Generation Partnership Project (3GPP), Mobile Competence Centre; 650, Route Des Lucioles; F-06921 Sophia-Antipolis Cedex; France, vol. RAN WG1, No. Korea; Nov. 25, 2001, Nov. 25, 2001 (Nov. 25, 2001), pp. 1-13, XP050095469, [retrieved on Nov. 25, 2001] the whole document.

Qualcomm Incorporated: "Remaining Details of LDPC Coding", 3GPP TSG RAN WG1 Meeting 91, 3GPP Draft; R1-1720700-Remaining Details of LDPC Coding, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 27, 2017-Dec. 1, 2017, Nov. 18, 2017 (Nov. 18, 2017), pp. 1-4, XP051370161, Retrieved from the Internet: URL: http://www.3gpp.org/ftp/tsg%5Fran/WG1%5FRL1/fTSGR1%5F91/Docs/ [retrieved on Nov. 18, 2017] the whole document.

ZTE, et al., "On Bit Level-Interleaving for LDPC Code", 3GPP-TSG RAN-WG1 NR Ad-Hoc#3, 3GPP Draft; R1-1715663 on Interleaving for LDPC Code Final, 3rd Generation Partnership Project (3GPP), Mobile Competence Centre; 650, Route Des Lucioles; F-06921 Sophia-Antipolis- Cedex; France, vol. Ran WG1, No. Nagoya, Japan; Sep. 18, 2017-Sep. 21, 2017, Sep. 17, 2017 (Sep. 17, 2017), pp. 1-12, XP051339127, Retrieved from the Internet URL: http://www.3gpp.org/ftp/Meetings_3GPP_SYNC/RAN1/Docs/ [retrieved on Sep. 17, 2017] p. 1.

* cited by examiner (6,4) Trapping set

LDPC INTERLEAVER DESIGN FOR IMPROVED ERROR FLOOR PERFORMANCE

CROSS-REFERENCE TO RELATED APPLICATION(S)

This application claims benefit of and priority to U.S. Provisional Patent Application Ser. No. 62/735,738, filed Sep. 24, 2018, herein incorporated by reference in its entirety as if fully set forth below and for all applicable purposes.

BACKGROUND

Field of the Disclosure

Aspects of the present disclosure relate to wireless communications, and more particularly, to a low density parity check (LDPC) interleaver design for improved error floor performance.

Description of Related Art

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

These multiple access technologies have been adopted in various telecommunication standards to provide a common protocol that enables different wireless devices to communicate on a municipal, national, regional, and even global level. New radio (e.g., 5G NR) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects provide a method for wireless communication by a transmitting device. The method generally includes encoding one or more information bits using a low density parity check (LDPC) code to produce a coded bit sequence. The coded bit sequence includes systematic bits and parity bits. The method generally includes storing the coded bit sequence in a circular buffer. The method generally includes performing rate matching on the coded bit sequence. The rate matching includes interleaving the parity bits with a partial interleaver and interleaving the systematic bits and the interleaved parity bits with a system bit priority mapping (SBPM) interleaver. The method generally includes mapping the SBPM interleaved bit sequence to constellation points according to a modulation scheme to produce a modulated bit sequence. The method generally includes transmitting the modulated bit sequence.

Certain aspects provide a method for wireless communication by a receiving device. The method generally includes demodulating a received signal corresponding to a coded bit sequence. The coded bit sequence includes interleaved systematic bits and parity bits. The method generally includes de-rate matching the coded bit sequence. The de-rate matching includes de-interleaving the systematic bits and parity bits with a SBPM deinterleaver and de-interleaving the parity bits with a partial deinterleaver. The method generally includes decoding the deinterleaved systematic bits and parity bits using an LDPC code to obtain one or more information bits.

Certain aspects provide an apparatus for wireless communication. The apparatus generally includes means for encoding one or more information bits using an LDPC code to produce a coded bit sequence. The coded bit sequence includes systematic bits and parity bits. The apparatus generally includes means for storing the coded bit sequence. The apparatus generally includes means for performing rate matching on the coded bit sequence. The means for rate matching includes means for partially interleaving the parity bits and means for SBPM interleaving the systematic bits and the interleaved parity bits. The apparatus generally includes means for mapping the SBPM interleaved bit sequence to constellation points according to a modulation scheme to produce a modulated bit sequence. The apparatus generally includes means for transmitting the modulated bit sequence.

Certain aspects provide an apparatus for wireless communication. The apparatus generally includes means for demodulating a received signal corresponding to a coded bit sequence. The coded bit sequence includes interleaved systematic bits and parity bits. The apparatus generally includes means for de-rate matching the coded bit sequence. The means for de-rate matching includes means for SBPM de-interleaving the systematic bits and parity bits and means for partially de-interleaving the parity bits. The apparatus generally includes means for decoding the deinterleaved systematic bits and parity bits using an LDPC code to obtain one or more information bits.

Certain aspects provide an apparatus for wireless communication. The apparatus generally includes a memory and at least one processor coupled with the memory. The memory and at least one processor are generally configured to encode one or more information bits using a LDPC code to produce a coded bit sequence. The coded bit sequence includes systematic bits and parity bits. The memory and at least one processor are generally configured to store the coded bit sequence in a circular buffer. The memory and at least one processor are generally configured to perform rate matching on the coded bit sequence. The rate matching includes partially interleaving the parity bits and SBPM interleaving the systematic bits and interleaved parity bits. The memory and at least one processor are generally configured to map the SBPM interleaved bit sequence to constellation points according to a modulation scheme to produce a modulated bit sequence. The memory and at least one processor are generally configured to transmit the modulated bit sequence.

Certain aspects provide an apparatus for wireless communication. The apparatus generally includes a memory and at least one processor coupled with the memory. The memory and at least one processor are generally configured to demodulate a received signal corresponding to a coded bit sequence. The coded bit sequence includes interleaved systematic bits and parity bits. The memory and at least one processor are generally configured to de-rate match the coded bit sequence. The de-rate matching includes SBPM de-interleaving the systematic bits and parity bits and partially de-interleaving the parity bits. The memory and at least one processor are generally configured to decode the deinterleaved systematic bits and parity bits using an LDPC code to obtain one or more information bits.

Certain aspects provide a computer readable medium storing computer executable code thereon for wireless communication. The computer readable medium generally stores code for encoding one or more information bits using an LDPC code to produce a coded bit sequence. The coded bit sequence includes systematic bits and parity bits. The computer readable medium generally stores code for storing the coded bit sequence in a circular buffer. The computer readable medium generally stores code for performing rate matching on the coded bit sequence. The code for rate matching includes code for interleaving the parity bits with a partial interleaver and code for interleaving the systematic bits and the interleaved parity bits with a SBPM interleaver. The computer readable medium generally stores code for mapping the SBPM interleaved bit sequence to constellation points according to a modulation scheme to produce a modulated bit sequence. The computer readable medium generally includes code for transmitting the modulated bit sequence.

Certain aspects provide a computer readable medium storing computer executable code thereon for wireless communication. The computer readable medium generally stores code for demodulating a received signal corresponding to a coded bit sequence. The coded bit sequence includes interleaved systematic bits and parity bits. The computer readable medium generally stores code for de-rate matching the coded bit sequence. The code for de-rate matching includes code for de-interleaving the systematic bits and parity bits with a SBPM deinterleaver and code for de-interleaving the parity bits with a partial deinterleaver. The computer readable medium generally stores code for decoding the deinterleaved systematic bits and parity bits using an LDPC code to obtain one or more information bits.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
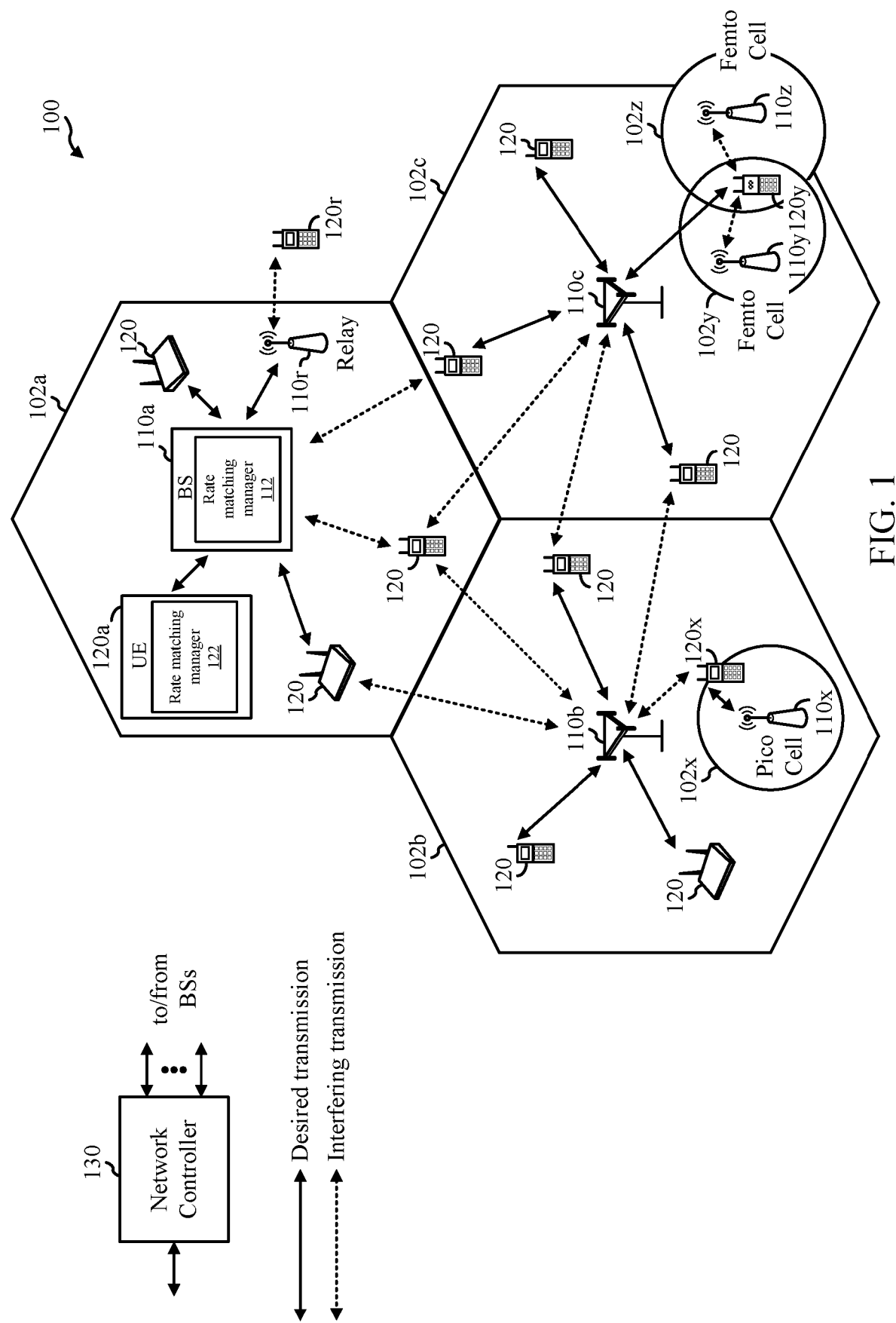
FIG. 1 is a block diagram conceptually illustrating an example telecommunications system, in accordance with certain aspects of the present disclosure.

Aspects of the present disclosure provide apparatus, methods, processing systems, and computer readable mediums for a low density parity check (LDPC) interleaver design for improved error floor performance.

In certain systems, a systematic bit priority mapping (SBPM) interleaver is used after LDPC coding and before constellation mapping. The SBPM interleaving may improve reliability of transmitted bits; however, at higher modulation orders (e.g., 16/64/256 QAM) the LDPC code may have a worse error floor as compared with non-SBPM interleaved LDPC codes. Therefore, an interleaver design for LDPC codes with improved error floor are desirable.

Aspects of the present disclosure provide for partial interleaving of parity bits, before the SBPM interleaving. Thus, the partial interleaving may improve the error floor performance, while still allowing for the improved reliability with the SBPM interleaving even at higher modulation orders.

The following description provides examples of an interleaver design for LDPC codes with improved error floor, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

For clarity, while aspects may be described herein using terminology commonly associated with 3G, 4G, and/or 5G NR wireless technologies, aspects of the present disclosure can be applied in other generation-based communication systems.

NR access (e.g., 5G NR) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

NR may utilize orthogonal frequency division multiplexing (OFDM) with a cyclic prefix (CP) on the uplink and downlink and include support for half-duplex operation using time division duplexing (TDD). OFDM partitions the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. The system bandwidth may also be partitioned into subbands.

In NR, a subframe can be 1 ms, but the basic TTI may be referred to as a slot. A subframe contains a variable number of slots (e.g., 1, 2, 4, 8, 16, . . . slots) depending on the subcarrier spacing (SCS). The NR resource block (RB) may be 12 consecutive frequency subcarriers. NR may support a base SCS of 15 KHz and other subcarrier spacing may be defined with respect to the base SCS, for example, 30 kHz, 60 kHz, 120 kHz, 240 kHz, etc. The symbol and slot lengths scale with the SCS. The CP length also depends on the SCS. 5G NR may also support beamforming and beam direction may be dynamically configured.

NR may support beamforming. Beam direction may be dynamically configured. NR may support multiple-input multiple-output (MIMO) transmissions with precoding. NR may support MIMO configurations in the DL with up to 8 transmit antennas with multi-layer DL transmissions up to 8 streams and up to 2 streams per UE. Aggregation of multiple cells may be supported with up to 8 serving cells.

FIG. 1 illustrates an example wireless communication network 100 in which aspects of the present disclosure may be performed. The wireless communication network 100 may be a 5G NR network.

As illustrated in FIG. 1, the wireless communication network 100 may include a number of base stations (BSs) 110a-z (each also individually referred to herein as BS 110 or collectively as BSs 110) and other network entities. A BS 110 may provide communication coverage for a particular geographic area, sometimes referred to as a "cell", which may be stationary or may move according to the location of a mobile BS. In some examples, the BSs 110 may be interconnected to one another and/or to one or more other BSs or network nodes (not shown) in wireless communication network 100 through various types of backhaul interfaces (e.g., a direct physical connection, a wireless connection, a virtual network, or the like) using any suitable transport network. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. ABS may support one or multiple cells.

A network controller 130 may couple to a set of BSs and provide coordination and control for these BSs. The network controller 130 may communicate with the BSs 110 via a backhaul.

Wireless communication network 100 may also include relay stations (e.g., relay station 110r), also referred to as relays or the like, that receive a transmission of data and/or other information from an upstream station (e.g., a BS 110a or a UE 120r) and sends a transmission of the data and/or other information to a downstream station (e.g., a UE 12 or a BS 110), or that relays transmissions between UEs 120, to facilitate communication between devices.

A transmitting device, such as a BS 110 on the downlink or a UE 120 on the uplink, may encode (the receiving device decodes in the other direction) one or more information bits using a LDPC code to produce a coded bit sequence including systematic bits and parity bits, and stores the coded bit sequence in a circular buffer. The BS 110 or UE 120 performs rate matching (the receiving device de-rate matches in the other direction) on the coded bit sequence. As shown in FIG. 1, the BS 110a has a rate matching manager 112 and the UE 120a has a rate matching manager 122. Rate matching generally includes bit selection and interleaving. In some examples, the BS 110a or UE 120a punctures one or more of the bits and those bits are not stored in the circular buffer. According to certain aspects, after the coding, the rate matching manager 112 and/or the rate matching manager 122 is configured to first interleave only the parity bits with a partial interleaver, and then interleaves both the systematic bits and the parity bits with the SBPM interleaver. After the interleaving, the BS 110a or UE 120a maps the SBPM interleaved bit sequence to constellation points according to a modulation scheme and transmits the modulated bit sequence.

Figure 2:
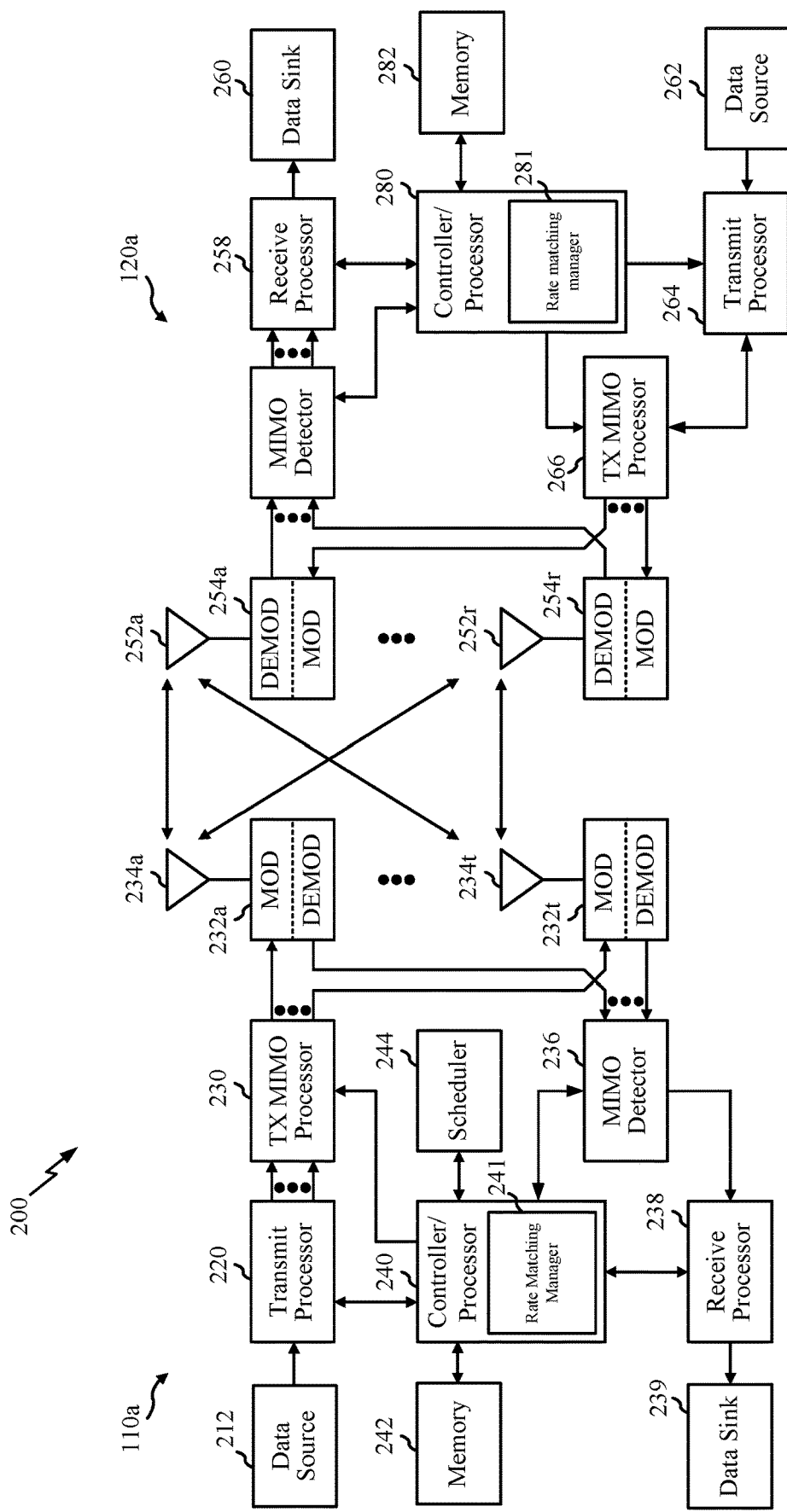
FIG. 2 is a block diagram conceptually illustrating a design of an example base station (BS) and user equipment (UE), in accordance with certain aspects of the present disclosure.

FIG. 2 illustrates example components of BS 110a and UE 120a (as depicted in FIG. 1), which may be used to implement aspects of the present disclosure.

At the BS 110a, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) 232a-232t. Each modulator 232 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 232a-232t may be transmitted via the antennas 234a-234t, respectively.

At the UE 120a, the antennas 252a-252r may receive the downlink signals from the BS 110a and may provide received signals to the demodulators (DEMODs) in transceivers 254a-254r, respectively. Each demodulator 254 may condition (e.g., filter, amplify, downconvert, and digitize) a respective received signal to obtain input samples. Each demodulator may further process the input samples (e.g., for OFDM, etc.) to obtain received symbols. A MIMO detector 256 may obtain received symbols from all the demodulators 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the demodulators in transceivers 254a through 254r (e.g., for SC-FDM, etc.), and transmitted to the BS 110a. At the BS 110a, the uplink signals from the UE 120a may be received by the antennas 234, processed by the modulators 232, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

Antennas 252, processors 266, 258, 264, and/or controller/processor 280 of the UE 120a and/or antennas 234, processors 220, 230, 238, and/or controller/processor 440 of the BS 110a may perform or direct the execution of processes for the techniques described herein for interleaver design for LDPC codes with improved error floor performance. As shown in FIG. 2, the controller/processor 240 of the BS 110a may have a rate matching manager 241 configured to perform rate-matching (and/or de-rate matching) in accordance with aspects of the present disclosure. As shown in FIG. 2, the controller/processor 280 of the BS 110a may have a rate matching manager 281 configured to perform rate-matching (and/or de-rate matching) in accordance with aspects of the present disclosure. The memories 242 and 282 may store data and program codes for BS 110a and UE 120a, respectively. A scheduler 444 may schedule UEs for data transmission on the downlink and/or uplink.

Figure 3:
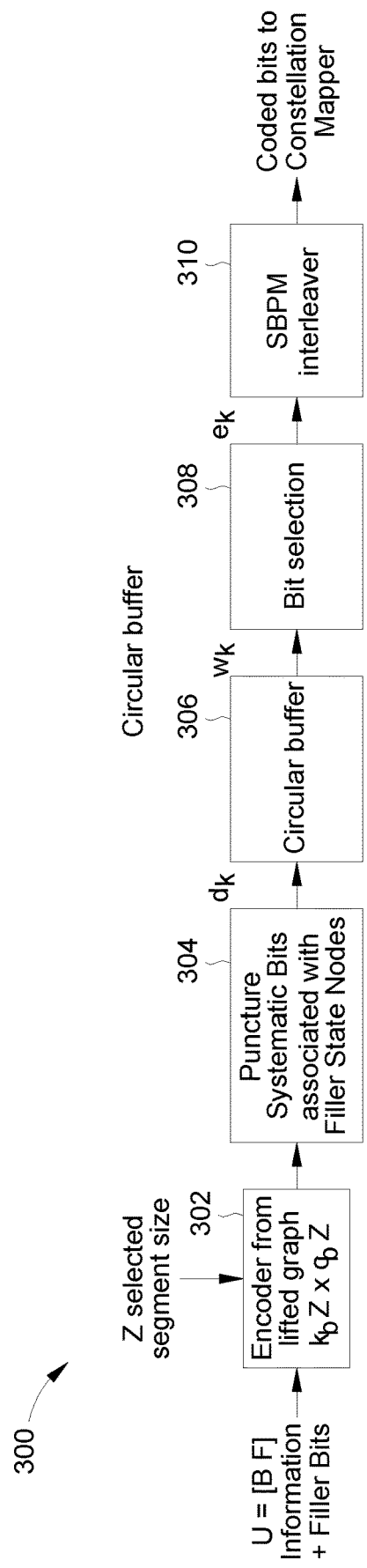
FIG. 3 is a block diagram illustrating an example low density parity check (LDPC) coding chain with a systematic bit priority mapping (SBPM) interleaver.
Figure 4:
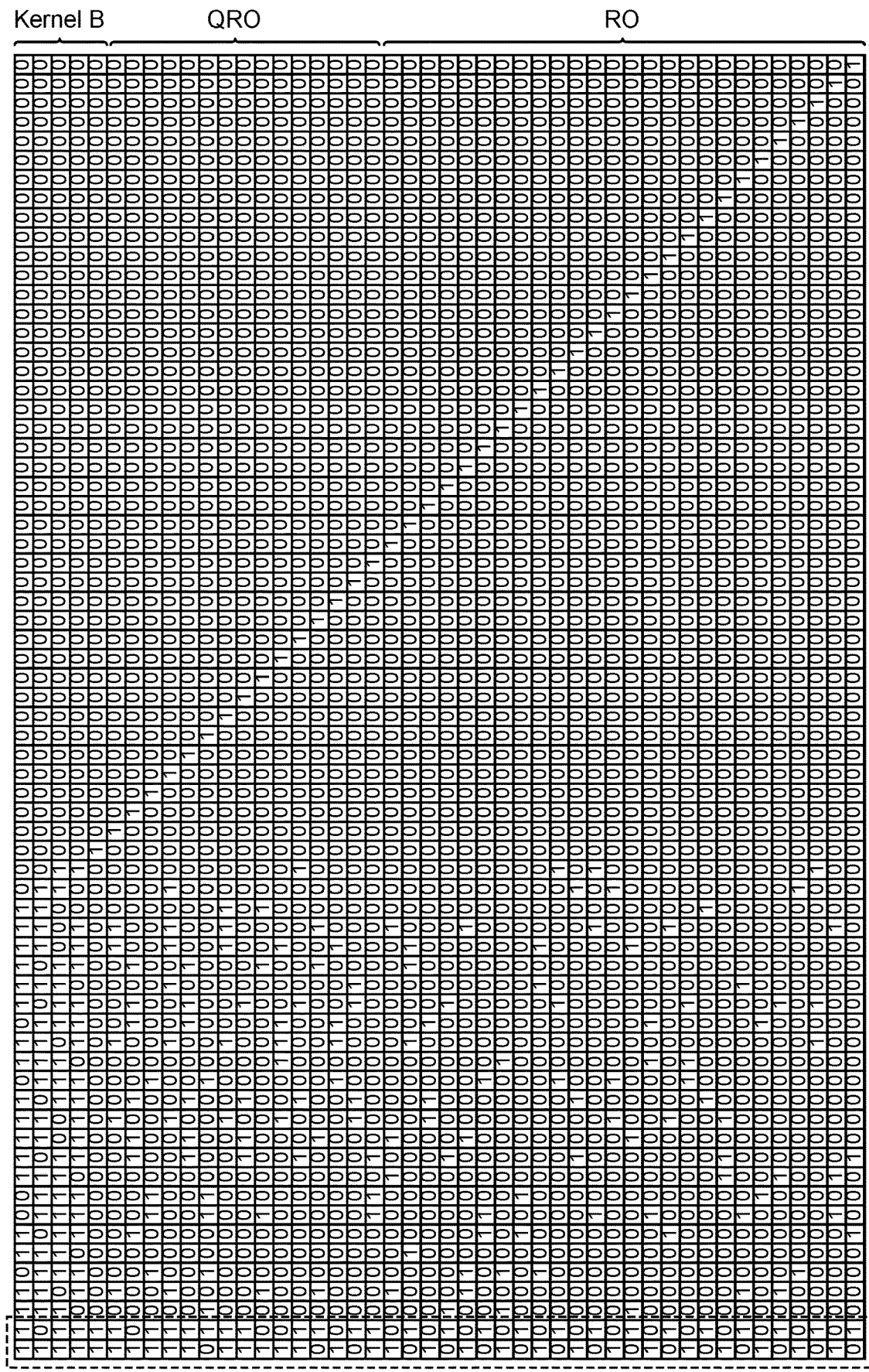
FIG. 4 illustrates an example base graph for LDPC encoding, in accordance with certain aspects of the present disclosure.

FIG. 3 illustrates an example coding chain 300. Certain systems use low density parity check (LDPC) codes for physical layer channel coding. As shown in FIG. 3, information bits U (and also filler bits if included) are encoded at the encoding block 302. The encoding may be LDPC encoding using a lifted base graph. FIG. 4 illustrates an example base graph for LDPC encoding, in accordance with certain aspects of the present disclosure. The example base graph may be referred to as base graph 1 (BG1). As shown in FIG. 4, the LDPC base graph has 68 columns (also referred to as variable nodes) including 22 columns corresponding to systematic bits and the remaining columns corresponding to parity bits including a large portion of one-degree parity bits. The BG1 has 46 corresponding check nodes. The first two (highest degree) systematic bits are punctured.

After the LDPC coding, some systematic bits of the encoded bits $d_k$ may be punctured at the puncturing block 304 and written to the circular buffer block 306. The bit selection block 308 may read coded bits $e_k$ from the circular buffer. Before constellation mapping, the coded bits are interleaved with at the SBPM interleaver block 310.

SBPM interleaving may improve the reliability of transmitted bits. However, at high order modulation (e.g., 16/64/256 QAM), the LDPC code performance may have a worse error floor compared with non-SBPM interleaved codes. As will be discussed in more detail below with respect to FIGS. 5-22, because SBPM interleaving maps systematic bits to more reliable constellation positions, a large number of one-degree variable nodes will have lower reliability and, accordingly, the corresponding check nodes will also be weak. This may lead to trapping sets in the LDPC decoder. Trapping set is one of the main factors causing iterative belief propagation decoding methods to fail with relatively few bit errors, resulting in error floor phenomenon in LDPC codes.

Figure 5:
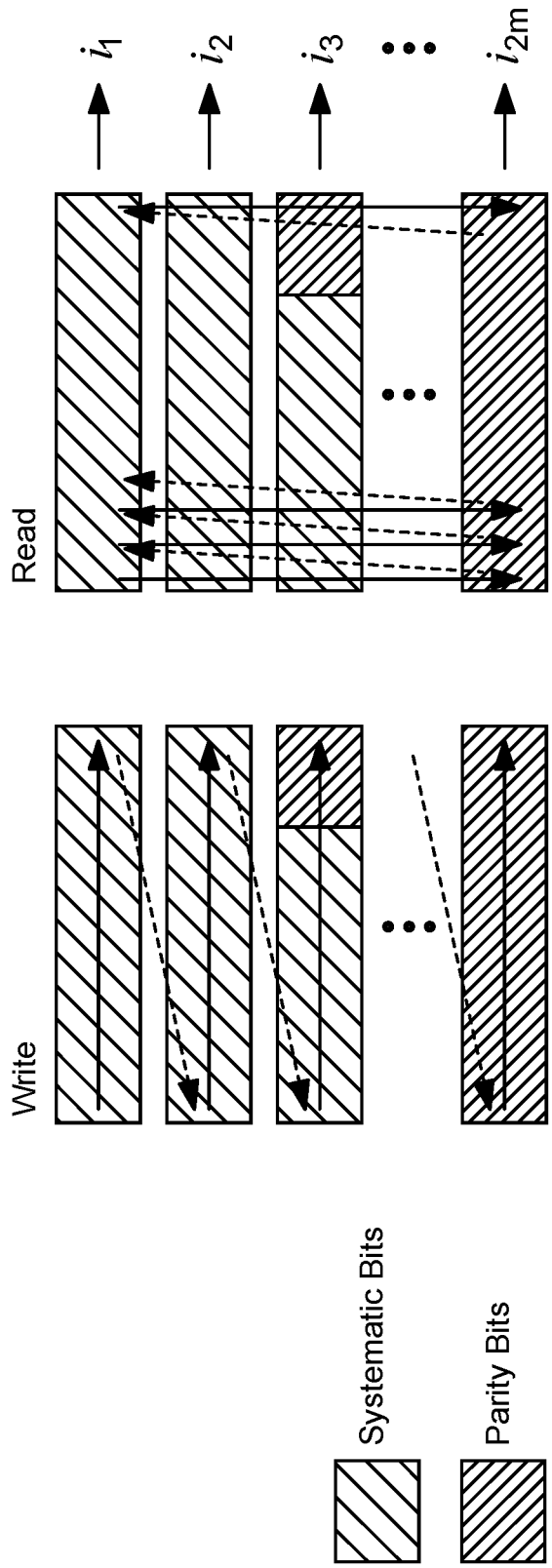
FIG. 5 is a diagram illustrating example row-wise write and column-wise read of an SBPM interleaver, in accordance with certain aspects of the present application.

FIG. 5 is a diagram illustrating example row-wise write and column-wise read of an SBPM interleaver, in accordance with certain aspects of the present application. As shown in FIG. 5, the SBPM interleaver is a row-column interleaver, meaning that the SBPM interleaver performs a row-wise write and a column-wise read. The number of rows is based on the modulation order. For example, the number of rows may be $\log_2$ (QAM size). As shown in FIG. 5, the LDPC code has systematic bits first followed by the parity bits.

Figure 6:
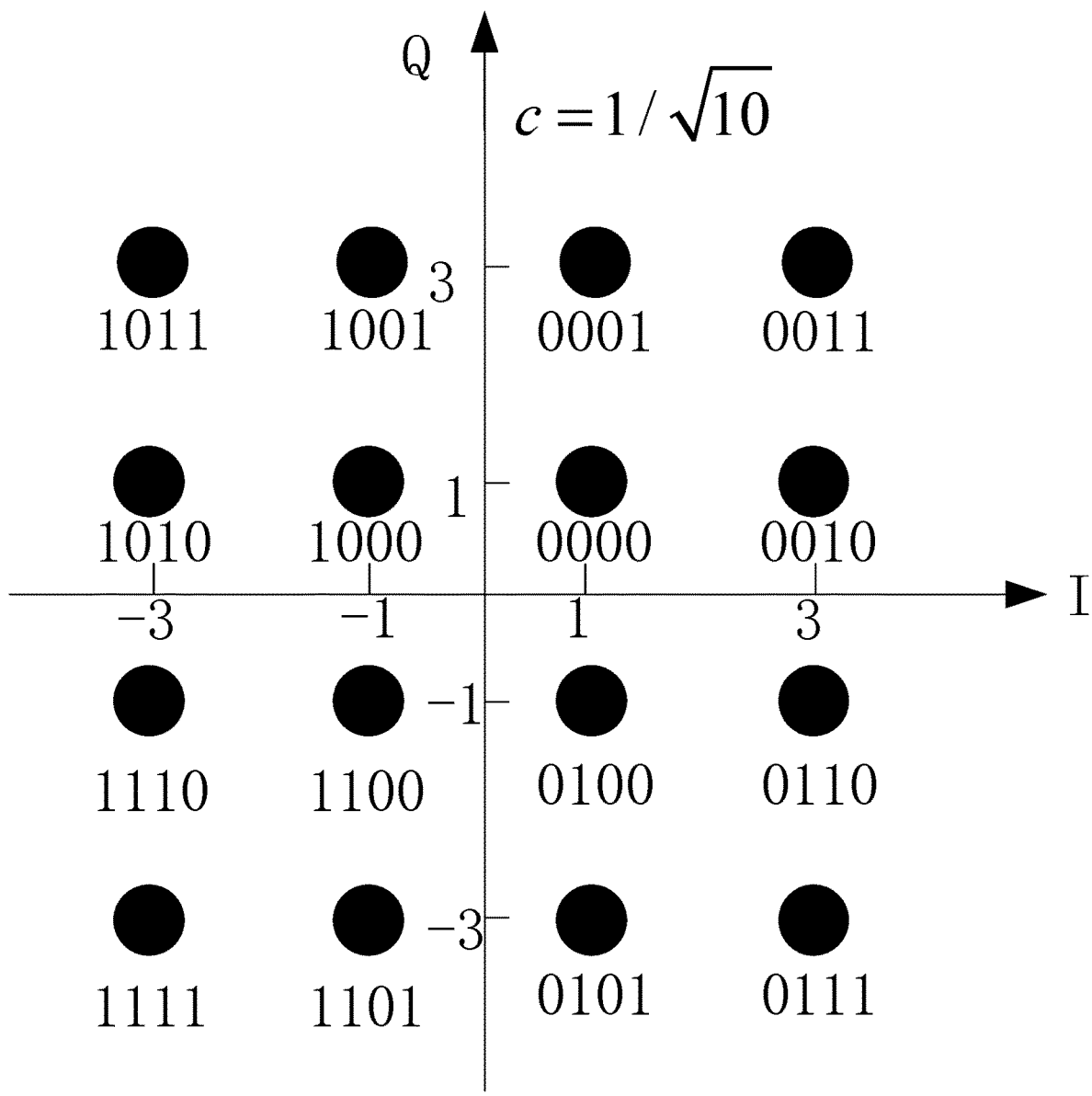
FIG. 6 illustrates an example constellation for 16 QAM, in accordance with certain aspects of the present disclosure.
Figure 7:
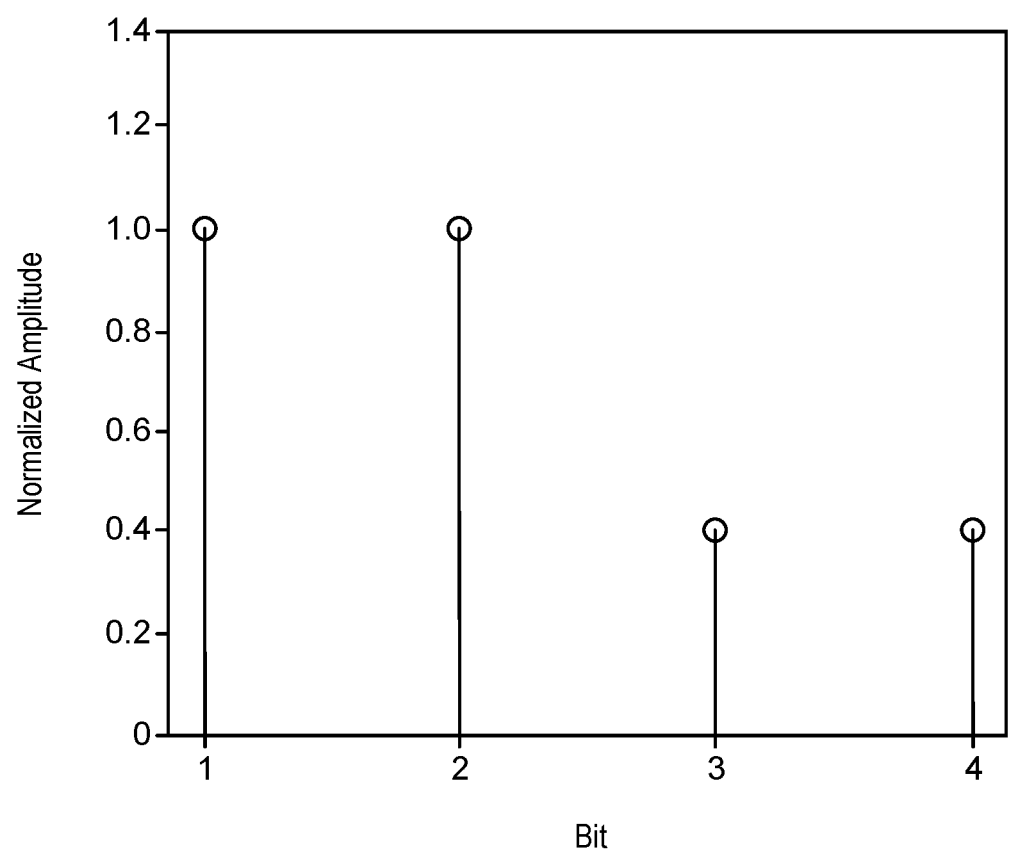
FIG. 7 illustrates example bit reliability for 16 QAM, in accordance with certain aspects of the present disclosure.
Figure 8:
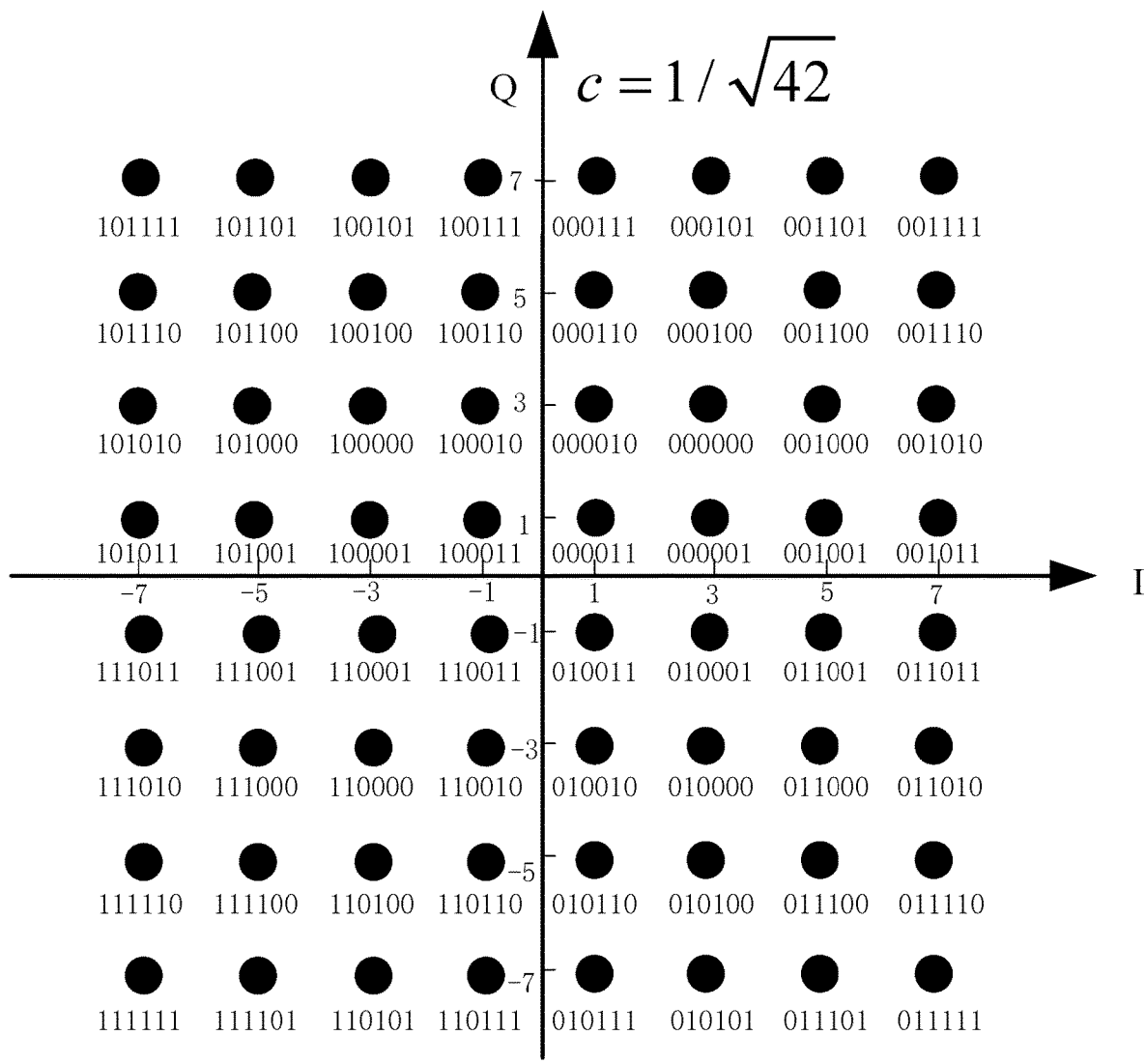
FIG. 8 illustrates an example constellation for 64 QAM, in accordance with certain aspects of the present disclosure.
Figure 9:
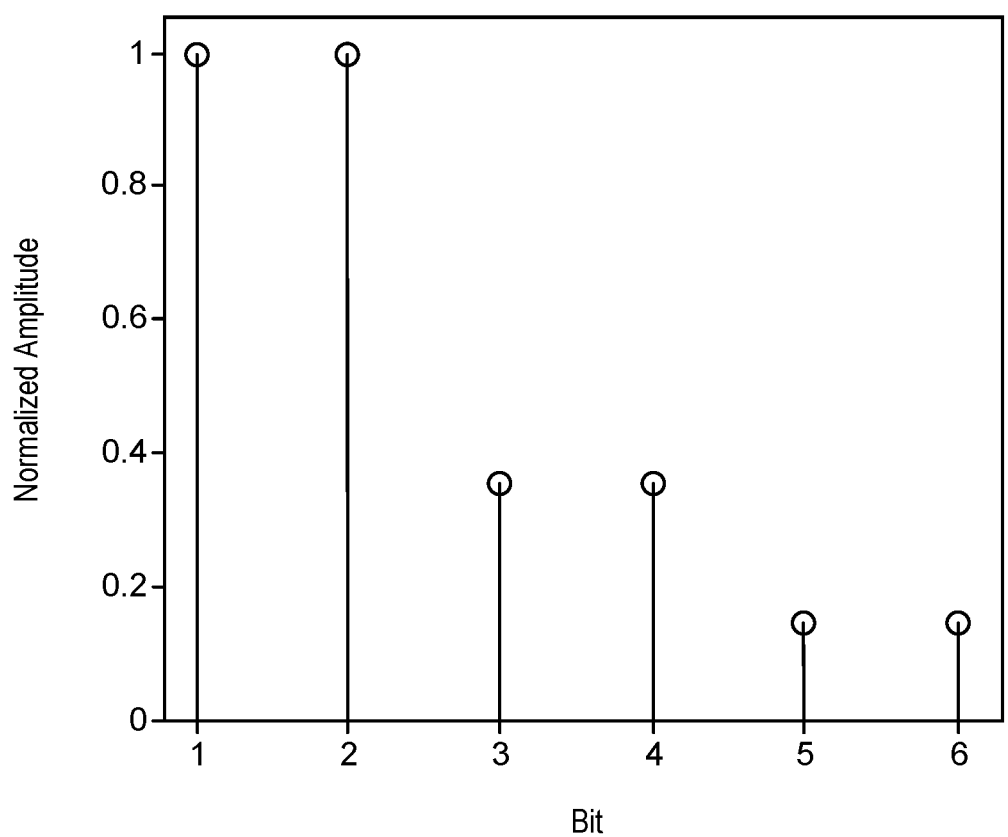
FIG. 9 illustrates example bit reliability for 64 QAM, in accordance with certain aspects of the present disclosure.

As shown in FIGS. 6-9, for higher modulation orders, such as 16/64/256 QAM, demodulated log likelihood ratios (LLRs) for different bits are unequal. For example, as shown in FIG. 6, for the constellation for 16 QAM there may be 4 bits per symbol. As shown in FIG. 7, the LLRs for the four bits are unequal (e.g., a normalized amplitude of 1 for bits 1 and 2, but 0.4 for bits 3 and 4). Similarly, FIGS. 8 and 9 illustrate the unequal bit reliability for the 6 bits per symbol for 64 QAM.

Figure 10:
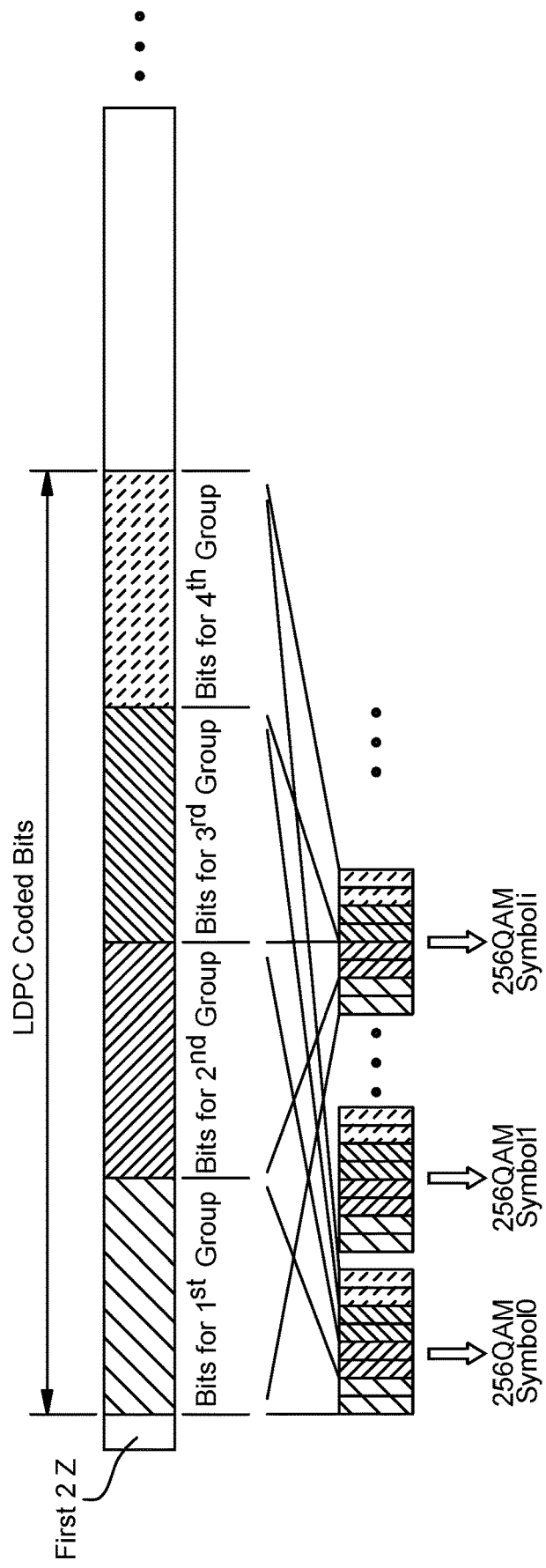
FIG. 10 illustrates example SBPM bit mapping scheme for 256 QAM, in accordance with certain aspects of the present disclosure.

As mentioned above, SBPM interleaving maps systematic bits to the more reliable positions in the constellation. FIG. 10 illustrates an example SBPM bit mapping scheme for 256 QAM (i.e., 8 bits for each symbol), in accordance with certain aspects of the present disclosure. As shown in FIG. 10, in each symbol, the SBPM maps the systematic bits to the more reliable bits. For example, in FIG. 10 the reliabilities of the bits are in descending order from left to right. There are bits (e.g., $b_0, b_1, \ldots b_7$) in each symbol. Thus, $b_0$ and $b_1$ have the highest reliability, and so on, with $b_7$ having the lowest reliability. In the LDPC coded bits, the information bits are first (e.g., the $1^{st}$ group) and therefore mapped to the first bits in each symbol as shown in FIG. 10.

Figure 11:
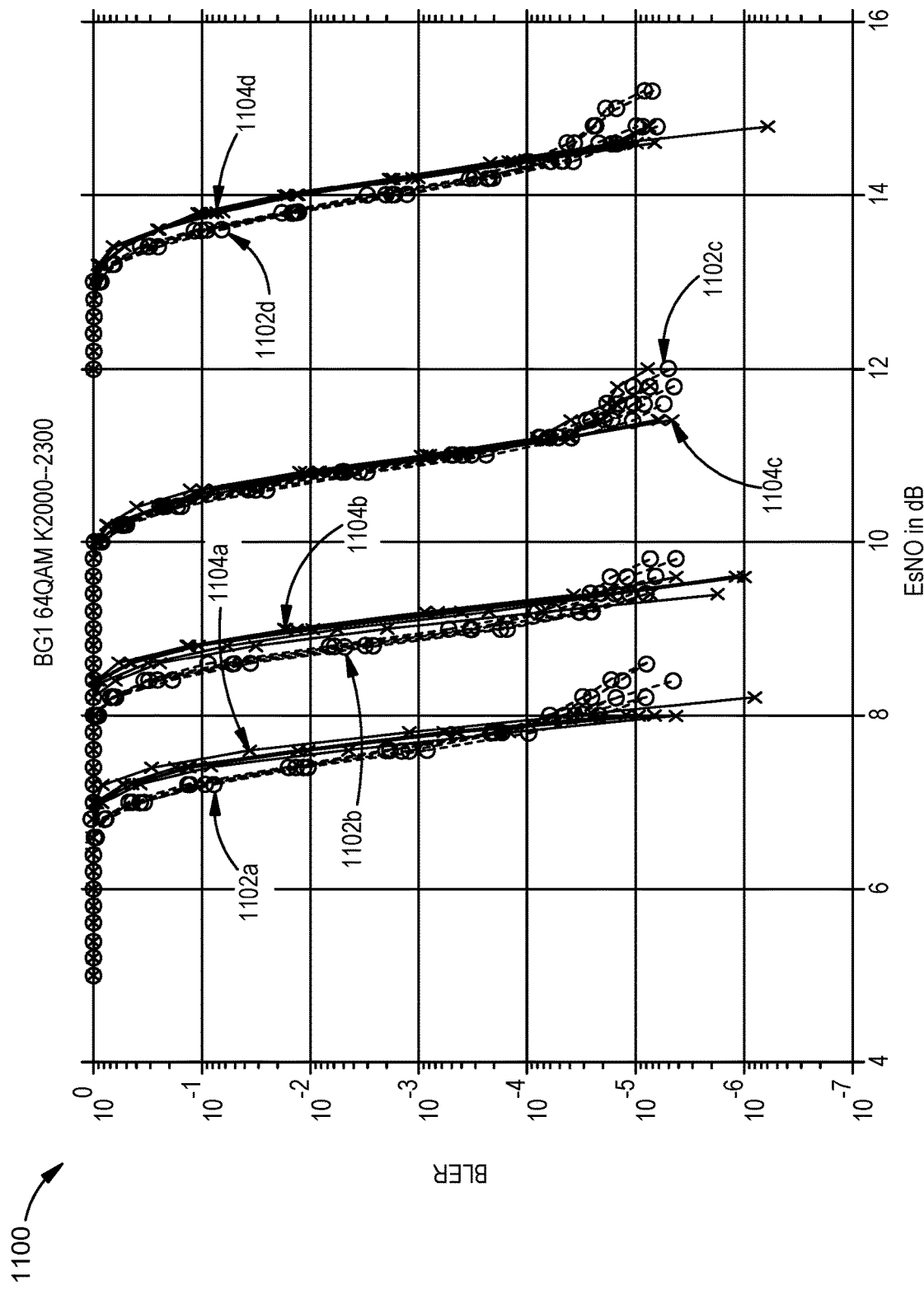
FIGS. 11-17 illustrates example error floor performance for SBPM.
Figure 12:
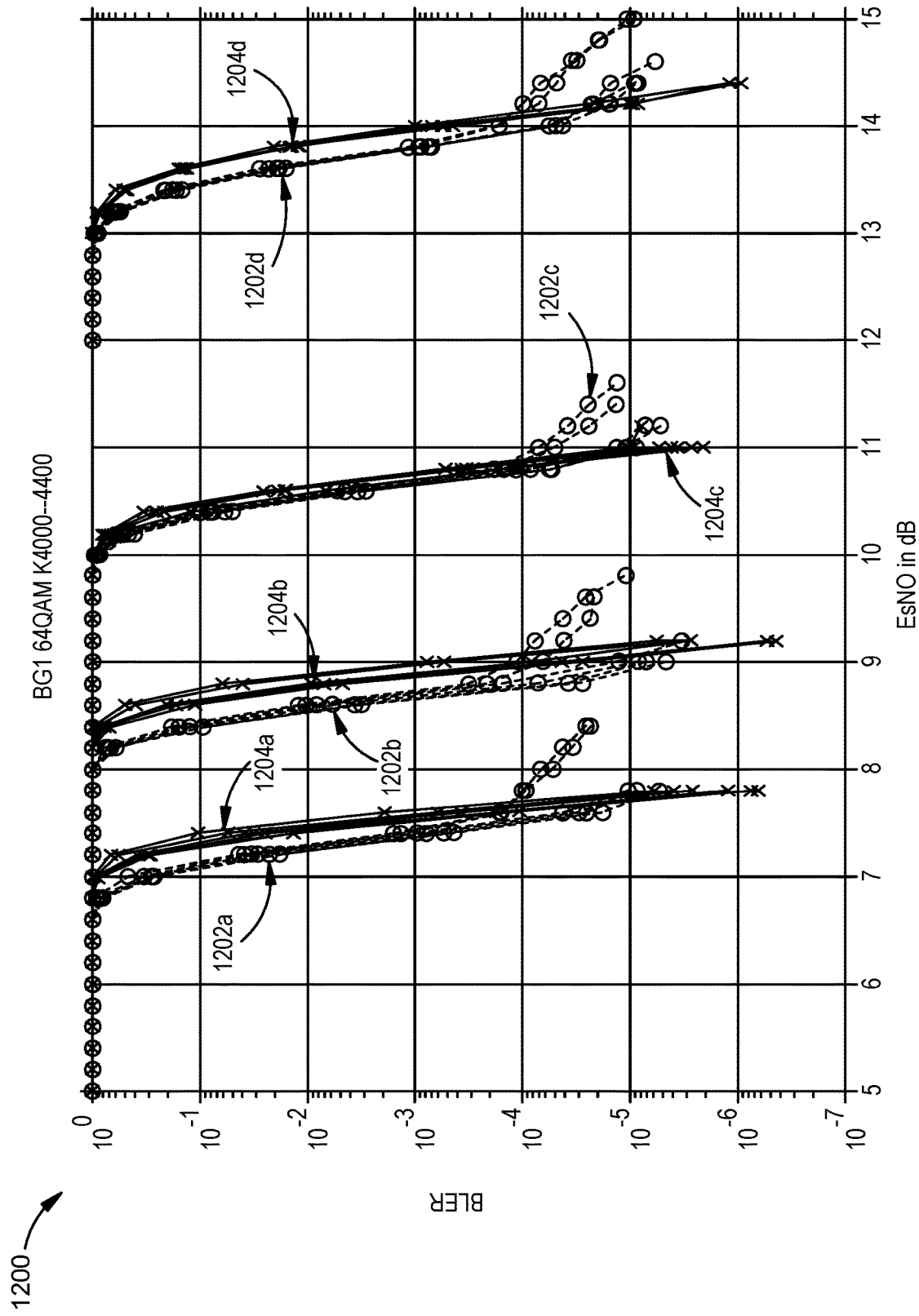

As mentioned above, after SBPM interleaving the LDPC code may have worse error floor. FIG. 11 is graph 1100 illustrating performance for SBPM interleaved LDPC code (curves 1102a-d) and non-SBPM interleaved LDPC code (curves 1104a-d) at 64 QAM for rate 1/3, rate 2/5, rate 1/2, and 2/3, respectively, for BG1 with K=2000-2300. FIG. 12 is a graph 1200 illustrating performance for SBPM interleaved LDPC code (curves 1202a-d) and non-SBPM interleaved LDPC code (curves 1204a-d) at 64 QAM for rate 1/3, rate 2/5, rate 1/2, and 2/3, respectively, for BG1 with K=4000-4400. As shown in FIGS. 11 and 12, at lower block error rate (BLER) targets (e.g., around $1 \times 10^{-5}$), the SBPM interleaved LDPC has error, whereas at the same BLER target the LDPC code without SBPM interleaving has no error floor. This may be problematic for certain services, such as ultra-reliable low-latency communications (URLLC) which target low BLER and/or for certain transport block sizes (TBSs) or parity check matrices (PCMs), etc.

Figure 13:
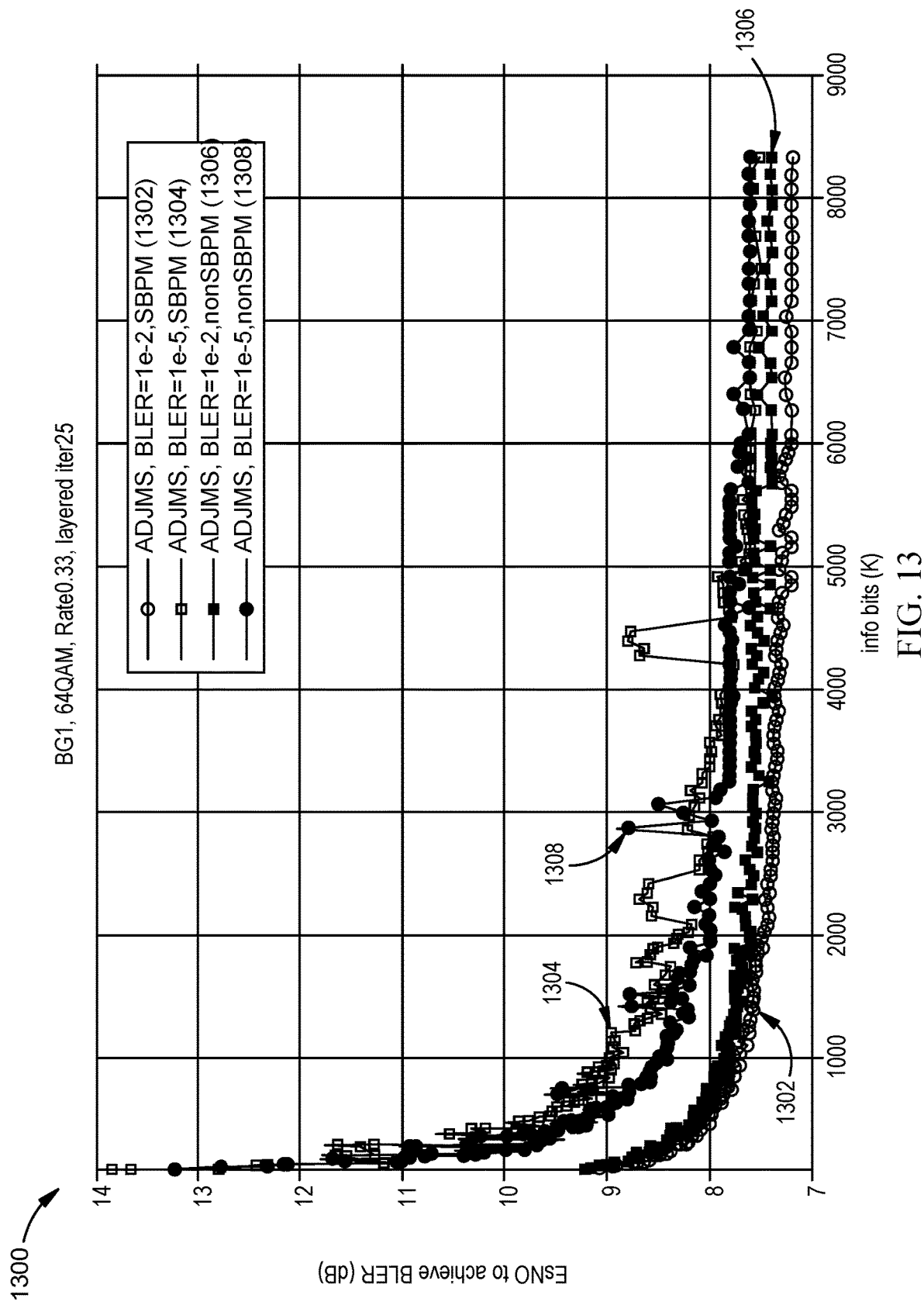
Figure 14:
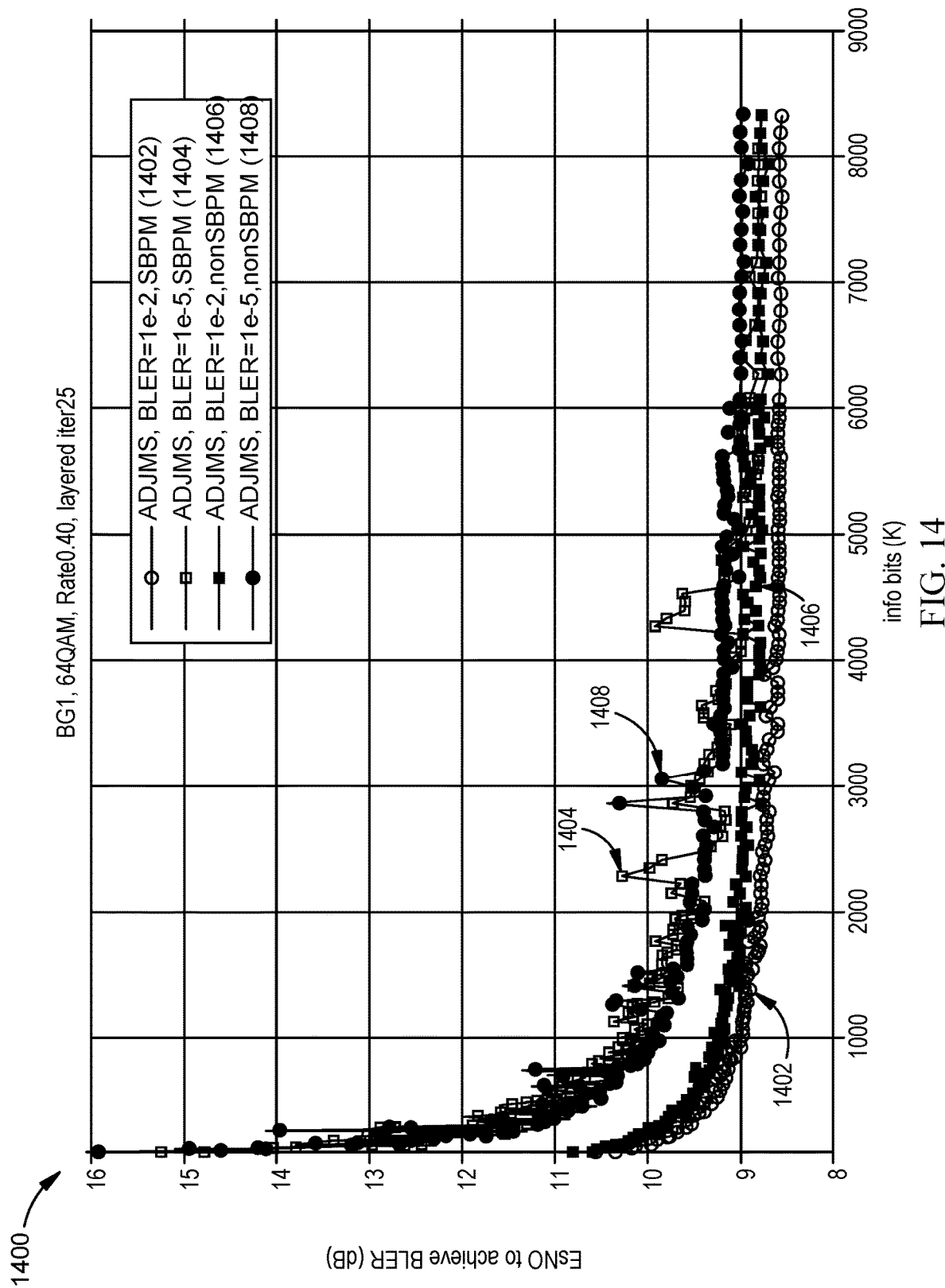
Figure 15:
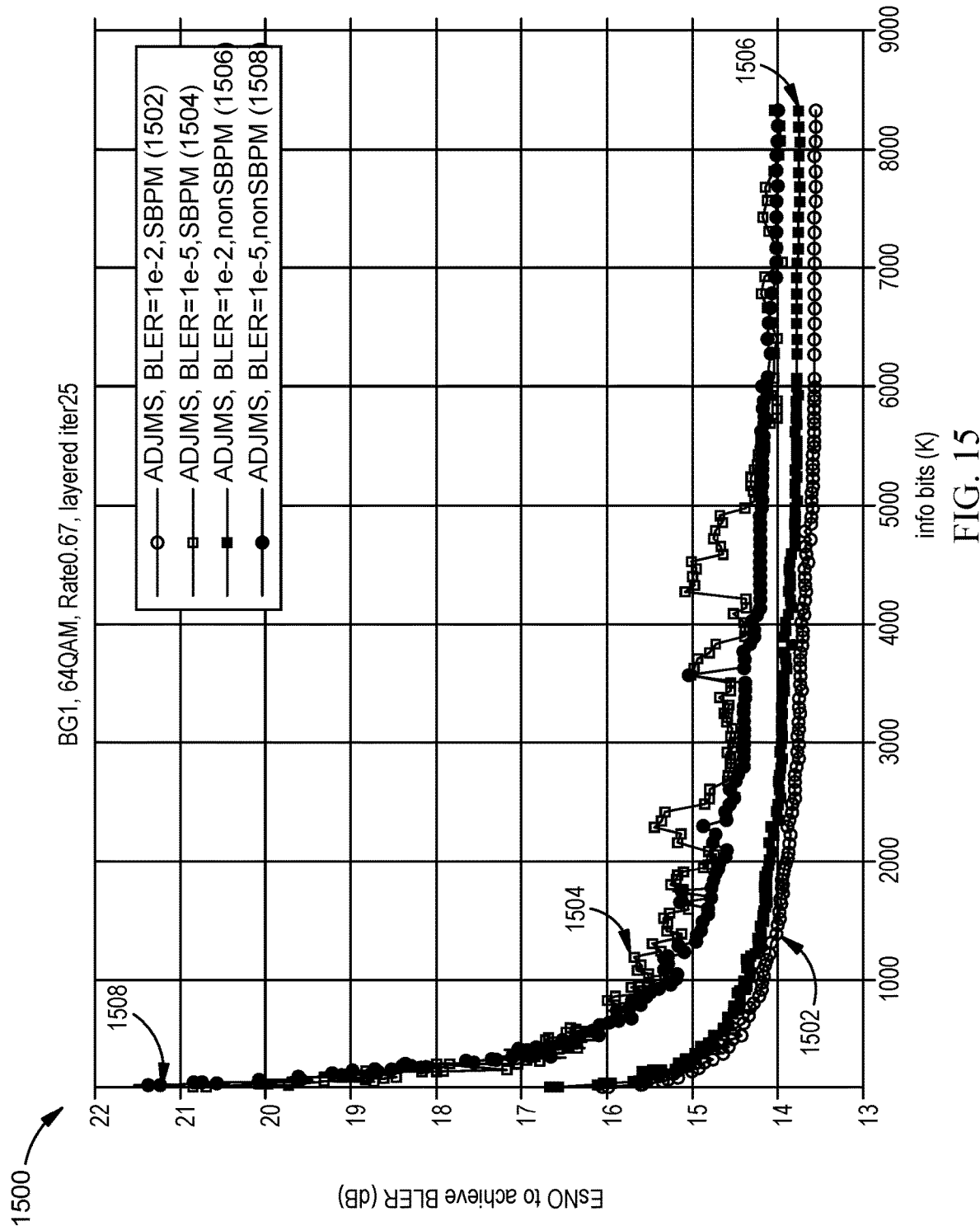

FIGS. 13-15 are example graphs 1300-1500 showing performance of information bits at rate 1/3, rate 2/5, and rate 2/3, respectively, for BG1, 64 QAM. The curves 1302, 1402, and 1502 may correspond to target BLER $1 \times 10^{-2}$ for SBPM interleaved LDPC code; the curves 1304, 1404, and 1504 may correspond to target BLER $1 \times 10^{-5}$ for SBPM interleaved LDPC code; the curves 1306, 1406, and 1506 may correspond to target BLER $1 \times 10^{-2}$ for non-SBPM interleaved LDPC code; and the curves 1308, 1408, and 1508 may correspond to target BLER $1 \times 10^{-5}$ for SBPM interleaved LDPC code. The spikes in the curve indicate error floor.

Figure 16:
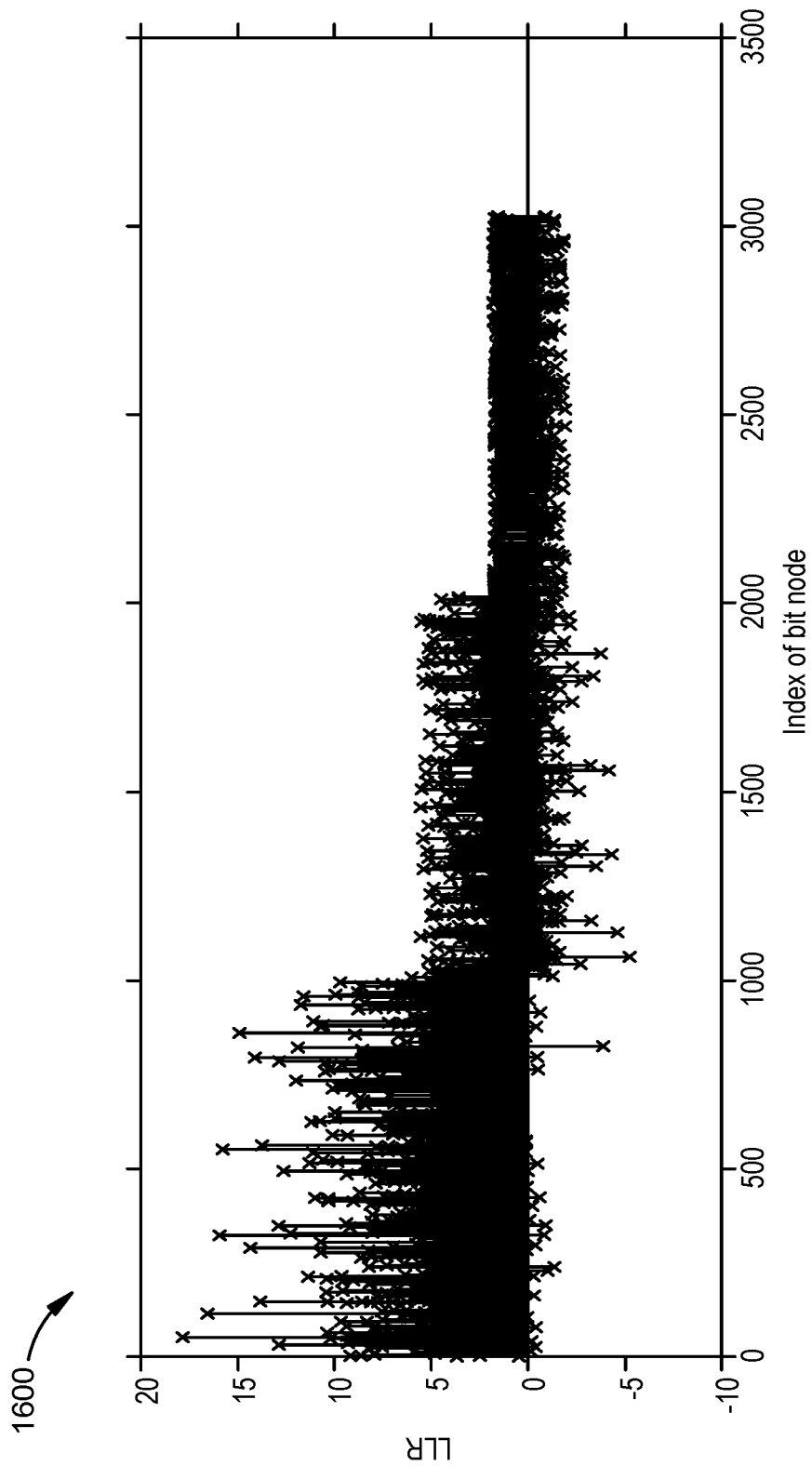
Figure 17:
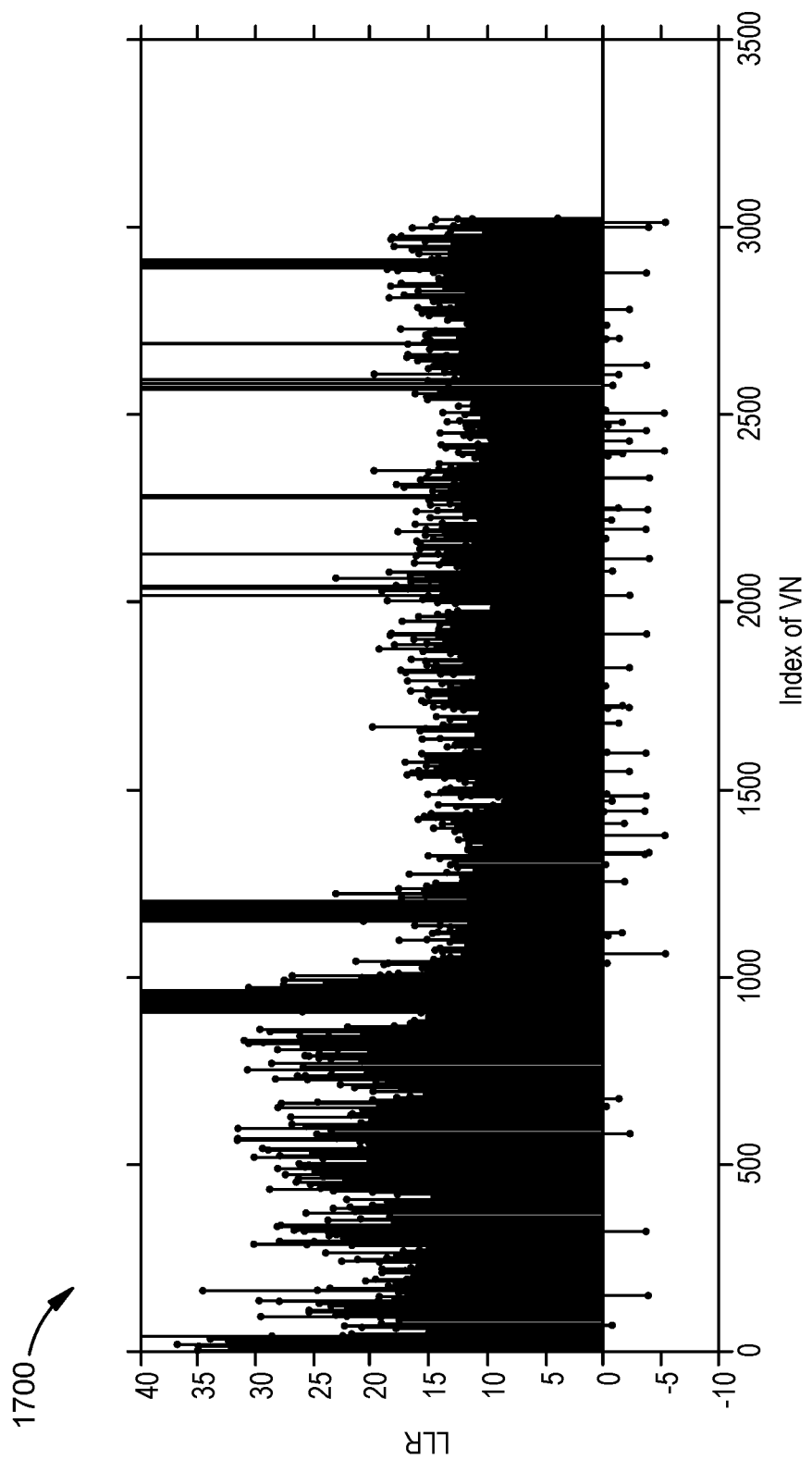

FIG. 16 is an example graph 1600 showing the LLR distribution for bit node indices of the received vector for (1008, 3024) LDPC with 64 QAM and SBPM interleaving. FIG. 17 is an example graph 1700 showing the LLR distribution after 25 iterations of layered decoding.

Figure 18:
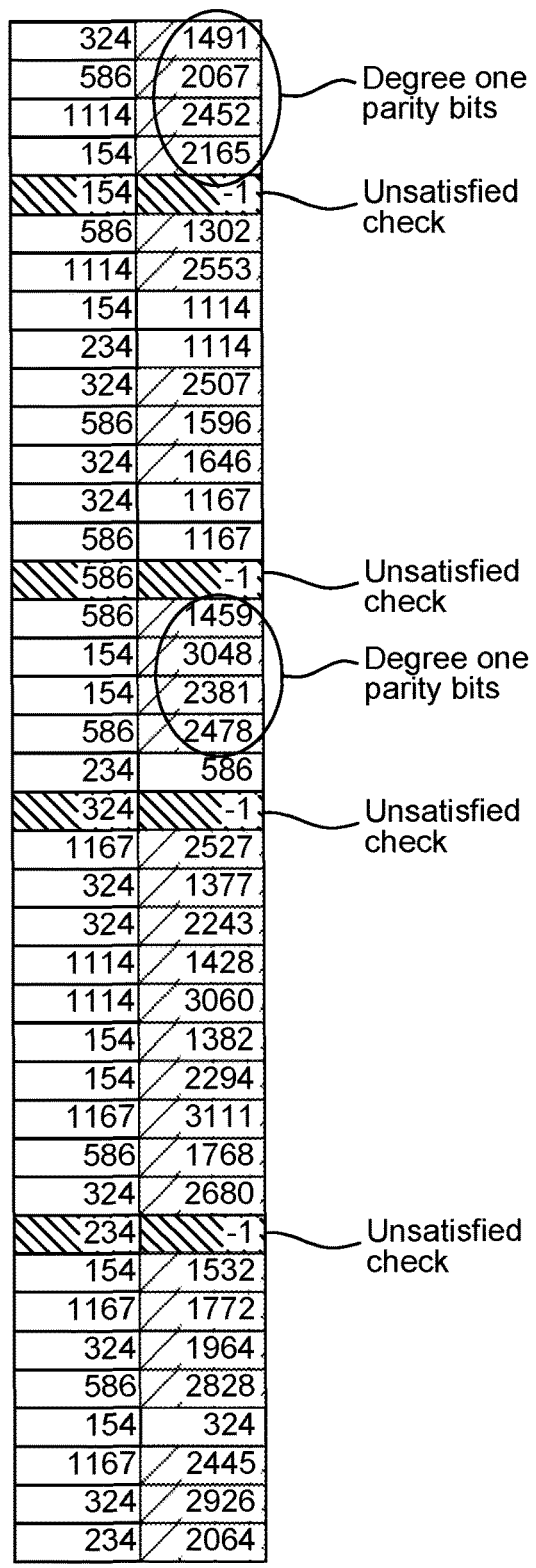
FIG. 18 is a table illustrating wrongly decoded bits of an LDPC code with SBPM interleaving.
Figure 19:
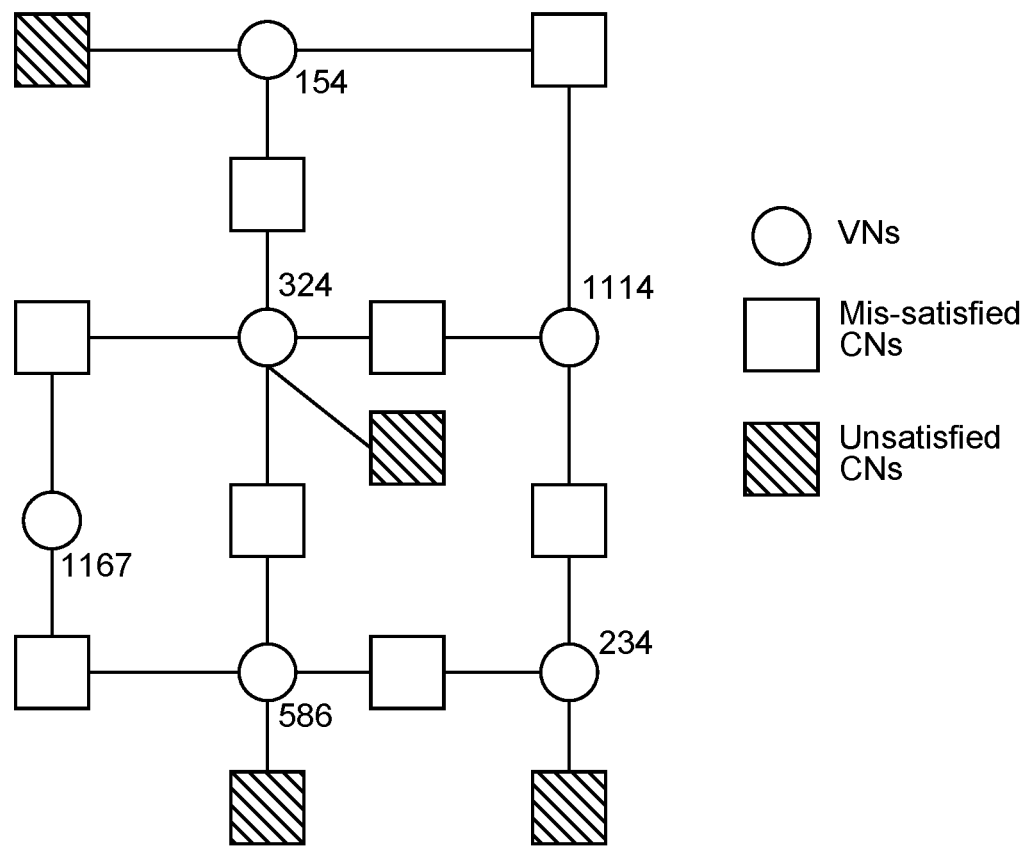
FIG. 19 illustrates an example trapping set associated with the wrongly decoded bits of FIG. 18.
Figure 20:
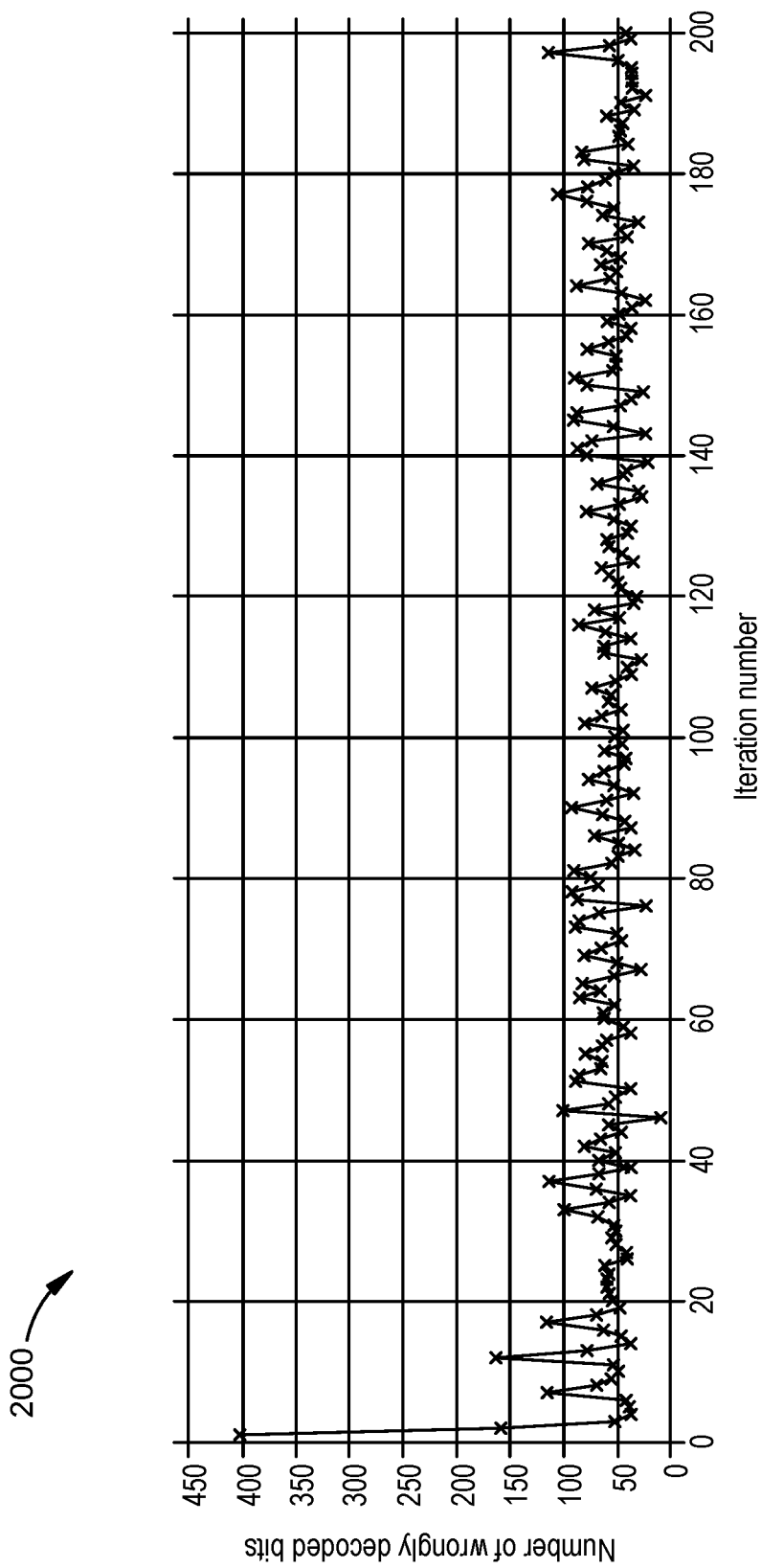
FIG. 20 illustrates wrongly decoded bits.
Figure 21:
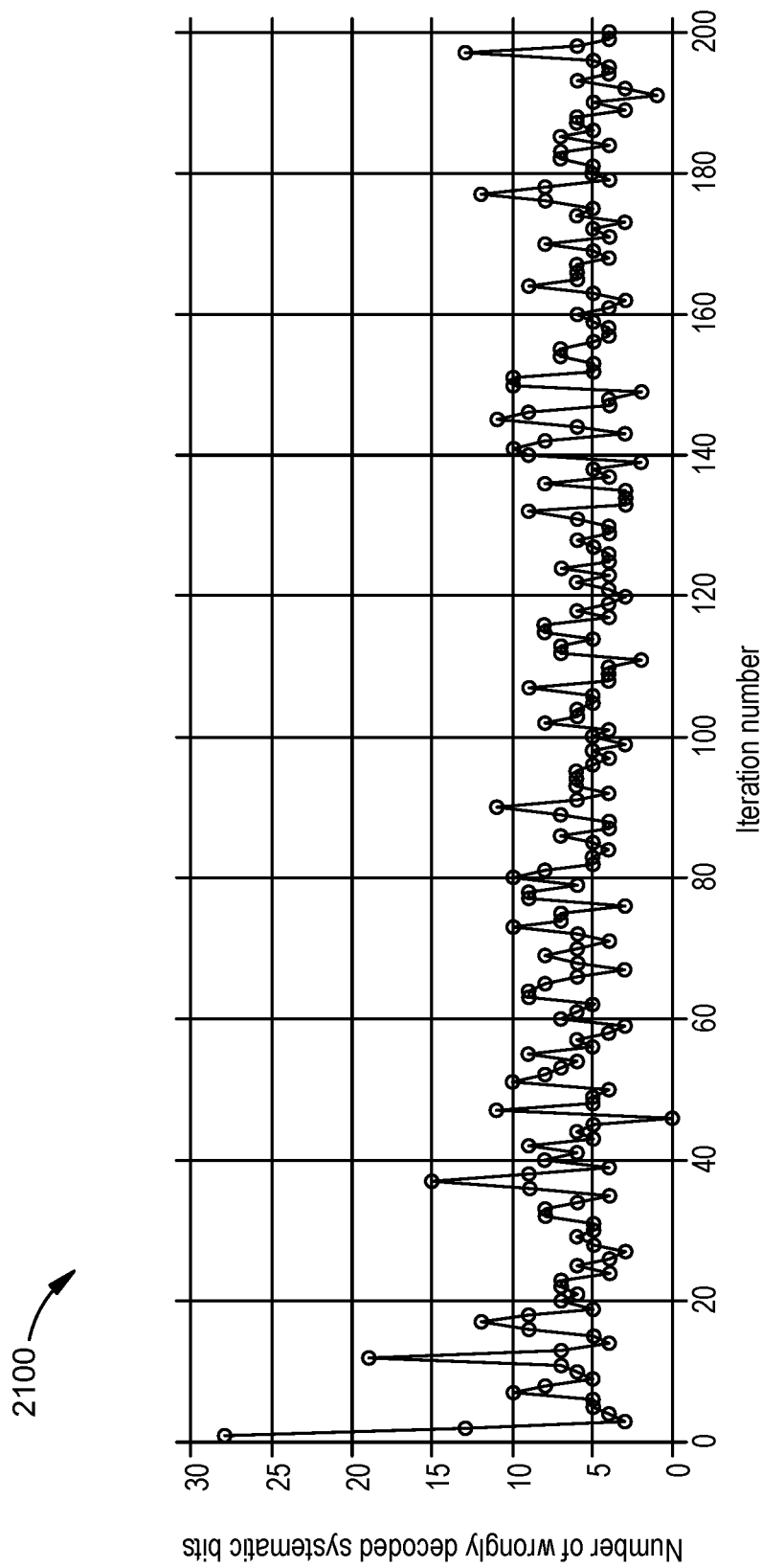
FIG. 21 illustrates wrongly decoded systematic bits.
Figure 22:
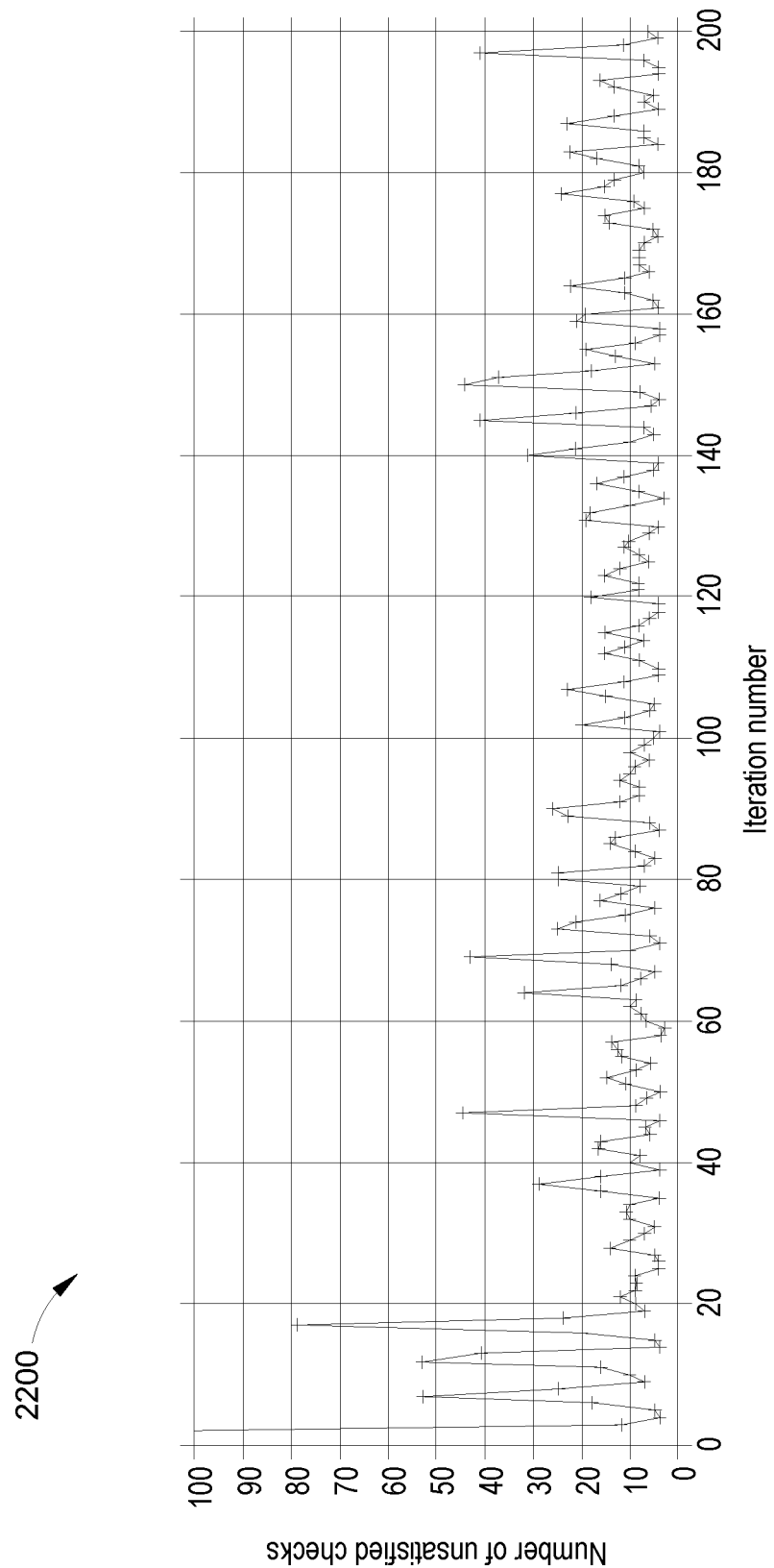
FIG. 22 illustrates unsatisfied checks.

FIG. 18 is a table 1800 illustrating wrongly decoded bits of an LDPC code with SBPM interleaving. Each row in the table 1800 contains wrongly decoded bit nodes that are connected to the same check nodes. After four iterations there are 4 unsatisfied checks, 4 systematic bit errors, and 31 degree-one parity bit errors. After 25 iterations, there are 4 unsatisfied checks, 6 systematic bit errors, and 52 degree-one parity bit errors. As discussed above, the large number of weak degree-one parity bits may result in decoder falling into trapping sets. FIG. 19 illustrates an example of a (6,4) trapping set, where 6 is the number of wrongly decoded bit nodes and 4 is the number of unsatisfied check nodes. FIGS. 20-22 are graphs 2000-2200 illustrating the evolution of a total number of wrongly decoded bits, number of wrongly decoded systematic bits, and number unsatisfied checks with a sufficiently large number of iterations, respectively. Typically, even after many decoding iterations, there are still a small number of wrongly decoded systematic bits and a larger number of wrongly decoded parity bits. A wrongly decoded systematic bit and a wrongly decoded degree-one parity bit may be connected to the same check node, resulting in a mis-satisfied check. The large portion of degree-one variable nodes makes the number of mis-satisfied check nodes to be large while keeps the number of unsatisfied checks small. With most degree-one variable nodes having very low reliability after SBPM interleaving, the decoder is more likely to get stuck in trapping set.

Thus, an LDPC interleaver with improved error floor is desirable.

Aspects of the present disclose provide an LDPC interleaver that leverages the improved reliability of the SBPM interleaver, while introducing a partial interleaver before SBPM interleaver that reduces the number of low reliability one-degree bits, thereby improving the error floor performance.

Example LDPC Interleaving Design for Improved Error Floor Performance

Figure 23:
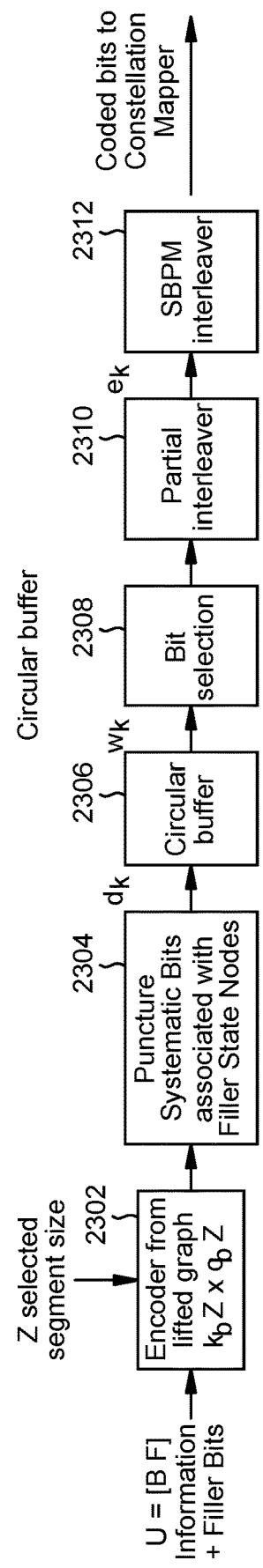
FIG. 23 is a block diagram illustrating an example LDPC coding chain with a partial interleaver and SBPM interleaver, in accordance with certain aspects.

FIG. 23 is a block diagram illustrating an example low density parity check (LDPC) coding chain 2300 with a partial interleaver and SBPM interleaver, in accordance with certain aspects. Referring back to FIG. 3, the LDPC coding chain 2300 may be similar to the coding chain 300; however, as shown in FIG. 23 the LDPC coding chain 2300 includes a partial interleaver block 2310 before the SBPM interleaver block 2312. The partial interleaver block 2310 interleaves only the parity bits of the LDPC code word. The partial interleaving may be random or based on a pattern. For example, the pattern may be a row-column interleaving pattern. The partial interleaver can also be done according to a different type of pattern. After the partial interleaver, all of the bits (systematic and parity) are passed through the SBPM interleaver.

With partial interleaving, the weak bits are distributed among all parity bits. For example, because the partial interleaving redistributes the order of the one-degree parity bits, when the SBPM interleaver performs a row-column interleaving at least some of the one-degree parity bits will be mapped to more reliable constellation positions. Thus, the portion of low reliability degree-one bits is reduced, thereby reducing the portion of weak check nodes.

Figure 24:
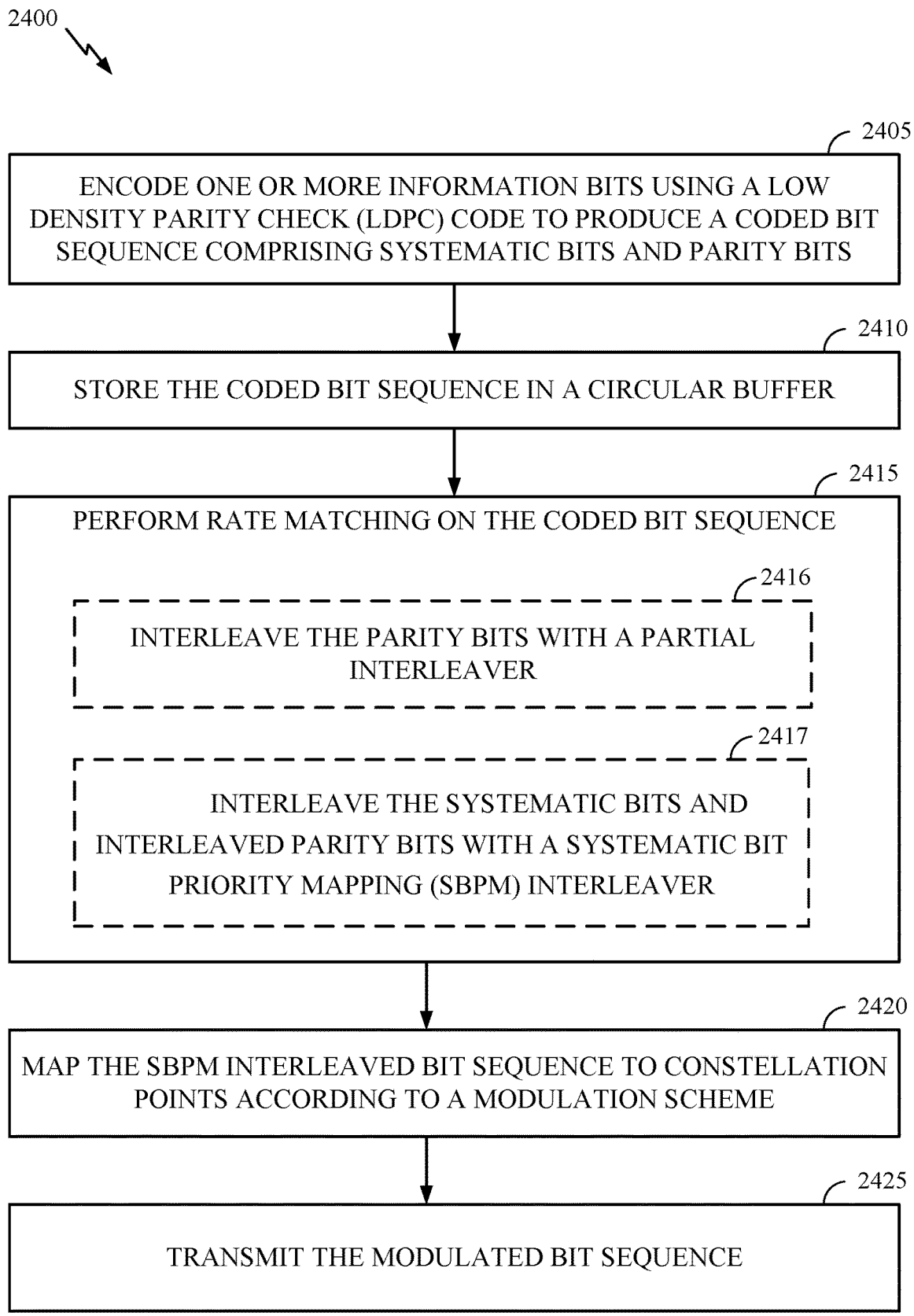
FIG. 24 is a flow diagram illustrating example operations by a transmitting device for SBPM interleaving with partial interleaving, in accordance with certain aspects of the present disclosure.

FIG. 24 is a flow diagram illustrating example operations 2400 for SBPM interleaving with partial interleaving, in accordance with certain aspects of the present disclosure. The operations 2400 may be performed by a transmitting device, for example, a BS (e.g., such as a BS 110a in the wireless communication network 100) on the downlink or a UE (e.g., such as a UE 120a in the wireless communication network 100) on the uplink.

The operations 2400 may begin, at 2405, by encoding one or more information bits using an LDPC code to produce a coded bit sequence (e.g., a code word) including systematic bits and parity bits. For example, the transmitting device may include an encoder, processor, processing system, and/or encoder circuitry configured to perform the LDPC encoding. The encoding may be based on a base graph (e.g., BG1 or BG2 as defined in the wireless standards). The encoding may include lifting the base graph and applying cyclic lifting values to permute edges in the base graph.

At 2410, the transmitting device stores the coded bit sequence in a circular buffer. For example, the transmitting device may include a memory or storage medium including the circular buffer. In some examples, the transmitting device punctures the LDPC code word. The transmitting device may puncture one or more systematic bits, such as bits corresponding to the first two, highest-degree, systematic bit variable nodes. The punctured bits are not stored in the circular buffer. The transmitting device may include a puncturing module and/or puncturing circuitry configured to perform the puncturing. The puncturing module/circuitry may be included in an encoder. The puncturing may be performed according to a puncturing pattern.

At 2415, the transmitting device performs rate matching on the coded bit sequence. Rate matching may include bit selection and interleaving. In some examples, the base graph is associated with a mother code rate and the rate matching may achieve a different code rate. The interleaving includes interleaving the parity bits (e.g., only the parity bits) with a partial interleaver, at 2416, and then interleaving the systematic bits and interleaved parity bits with a SBPM interleaver at 2417. The partial interleaver may be random or according to a defined (e.g., predefined) pattern. In some examples, the partial interleaver redistributes degree-one parity bits in the bit sequence, such that one or more of the degree-one parity bits are mapped to a bit position having a higher reliability than one or more other bits having a higher degree.

The SBPM interleaver may operate as discussed above (for example, with respect to FIG. 5). The transmitting device includes first interleaving circuitry configured to perform the partial interleaving and second interleaving circuitry configured to perform the SBPM interleaving. The transmitting device may include circuitry configured to perform bit selection.

At 2420, the transmitting device maps the SBPM interleaved bit sequence to constellation points according to a modulation scheme to produce a modulated bit sequence. In some examples, the modulation scheme is a higher order modulation scheme such as 16 QAM, 64 QAM, or 256 QAM. The transmitting device may include a modulator and/or constellation mapping circuitry configured to perform the mapping.

At 2425, the transmitting device transmits the modulated bit sequence. For example, the transmitting device includes a transmitter, transceiver, and/or antenna configured to transmit the modulated bit sequence.

Figure 25:
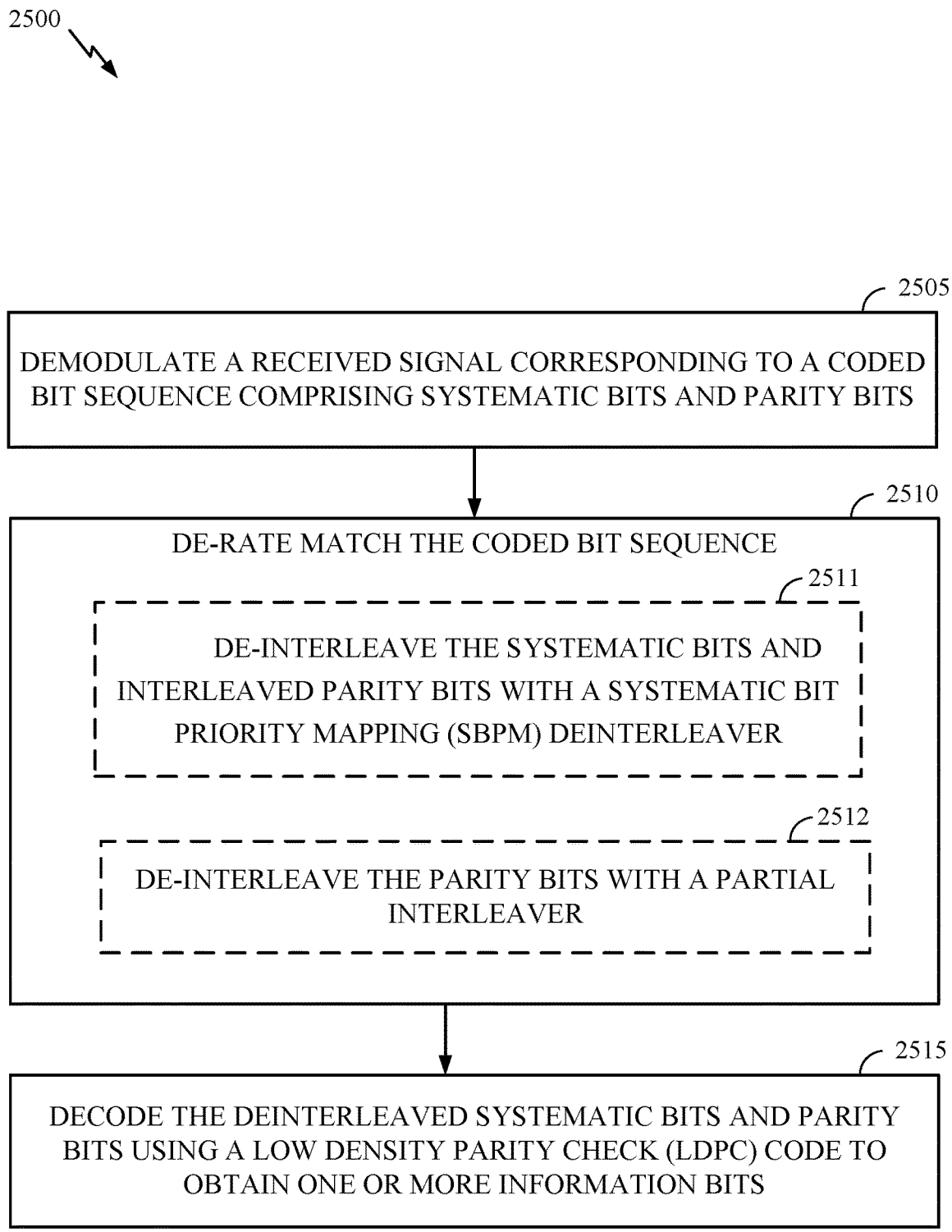
FIG. 25 is a flow diagram illustrating example operations by a receiving device for SBPM interleaving with partial interleaving, in accordance with certain aspects of the present disclosure.

FIG. 25 is a flow diagram illustrating example operations 2500 for SBPM interleaving with partial interleaving, in accordance with certain aspects of the present disclosure. The operations 2500 may be performed, for example, by a receiving device which may be a BS (e.g., a BS 110a in the wireless communication network 100) on the uplink or a UE (e.g., a UE 120a in the wireless communication network 100) on the downlink.

The operations 2500 may begin, at 2505, by demodulating a received signal corresponding to a coded bit sequence including interleaved systematic bits and parity bits. The receiving device may include a demodulator and/or demodulation circuitry configured to perform the demodulation. In some examples, the demodulation is 16 QAM, 64 QAM, or 256 QAM demodulation. In some examples, the receiving device depunctures the coded bit sequence. The depuncturing may be performed according to a depuncturing pattern. The pattern may be configured or received. The receiving device may include depuncturing circuitry configured to perform the depuncturing. In some examples, the depuncturing circuitry may be included in a decoder or as part of decoding circuitry.

At 2510, the receiving device de-rate matches the coded bit sequence. The de-rate matching includes de-interleaving the systematic bits and parity bits with a SBPM deinterleaver at 2511, and then de-interleaving the parity bits (e.g., only the parity bits) with a partial deinterleaver at 2512. The partial de-interleaving may be random or according to a defined (e.g., predefined) pattern (e.g., row-column de-interleaving). The receiving device may include first de-interleaving circuitry configured to perform the SBPM de-interleaving and second de-interleaving circuitry configured to perform the partial de-interleaving.

At 2515, the receiving device decodes the deinterleaved systematic bits and parity bits using an LDPC code to obtain one or more information bits.

Figure 26:
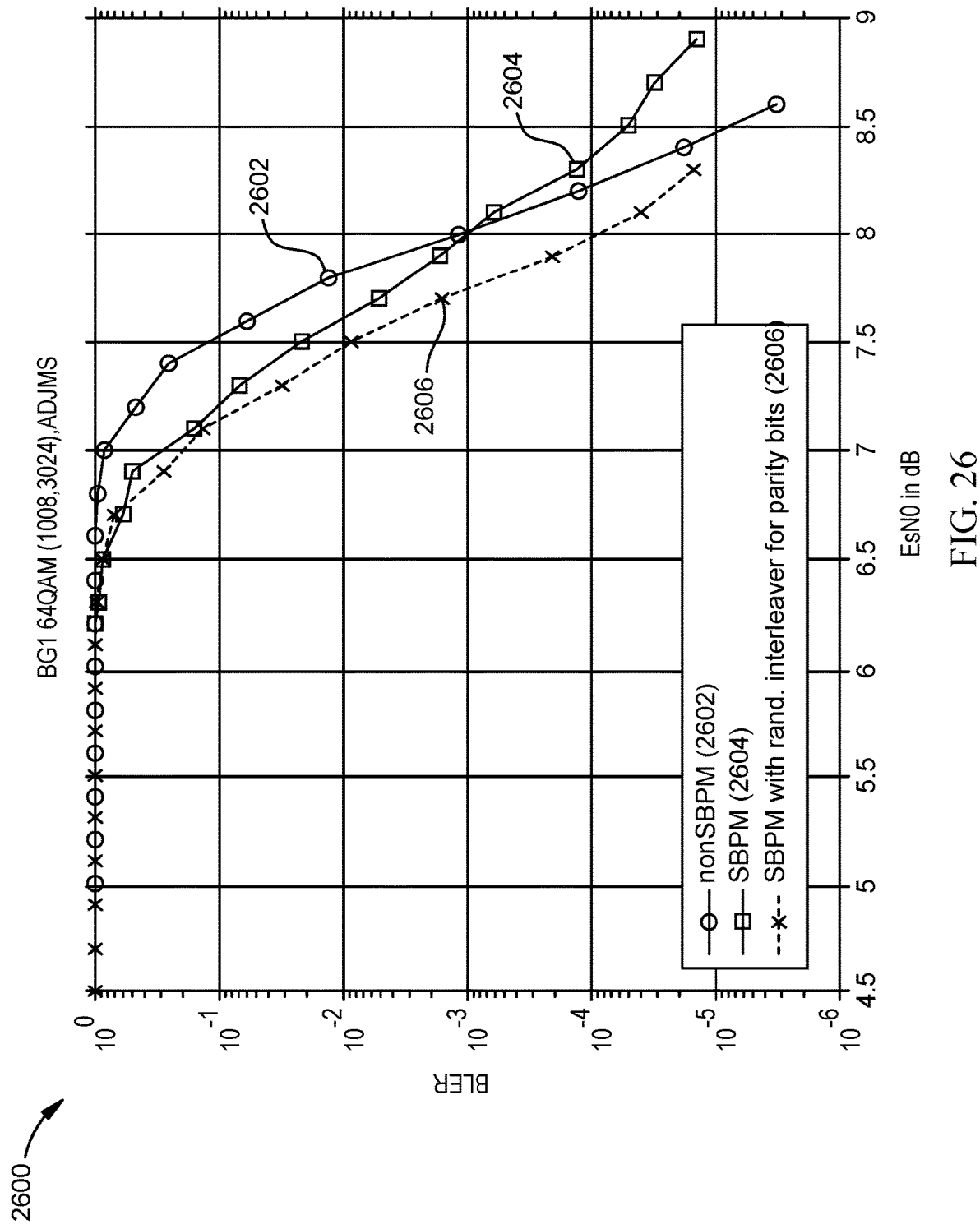
FIG. 26 is a graph showing improved error floor for SBPM interleaving with partial interleaving, in accordance with certain aspects of the present disclosure.
Figure 27:
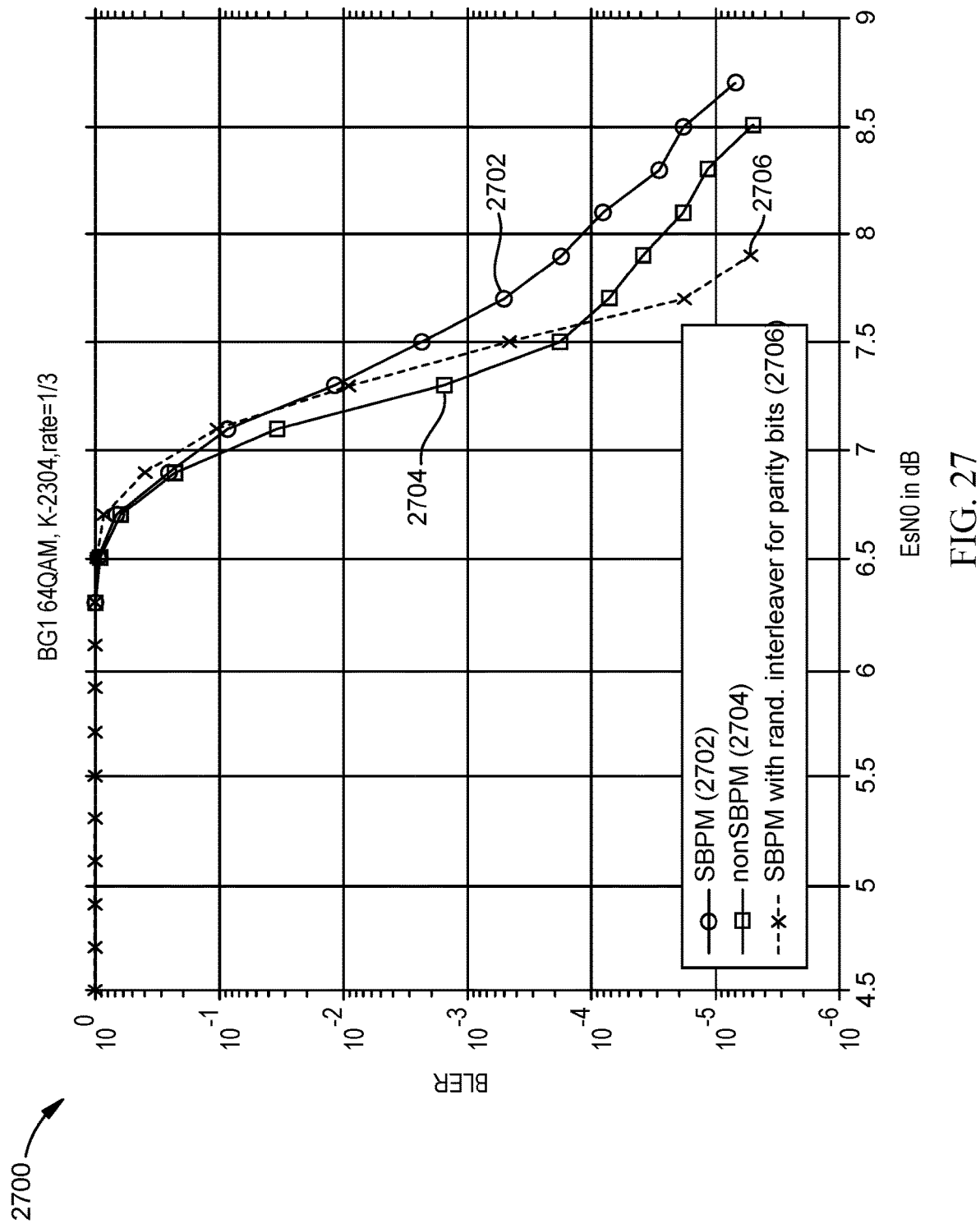
FIG. 27 is a graph showing improved error floor for SBPM interleaving with partial interleaving, in accordance with certain aspects of the present disclosure.

Simulation results show that the proposed interleaver design scheme largely improves the performance of SBPM especially at error floor region. FIG. 26 is a graph 2600 showing improved error floor for SBPM interleaving with partial interleaving, in accordance with certain aspects of the present disclosure. The graph 2600 is for a (1008, 3024) LDPC code with BG1, 64 QAM, and SBPM. The curves 2602, 2604, and 2606 show the performance for non-SBPM codes, SBPM interleaved codes, and SBPM interleaved codes with partial interleaving respectively. FIG. 27 is a graph 2700 showing improved error floor for SBPM interleaving with partial interleaving, in accordance with certain aspects of the present disclosure. The graph 2700 is for a (2304, 6912) LDPC code with BG1, 64 QAM, and SBPM. The curves 2702, 2704, and 2706 show the performance for non-SBPM codes, SBPM interleaved codes, and SBPM interleaved codes with partial interleaving respectively. As shown in FIG. 26 and FIG. 27, the proposed interleaver design scheme significantly improves the performance of SBPM especially at error floor region.

Figure 28:
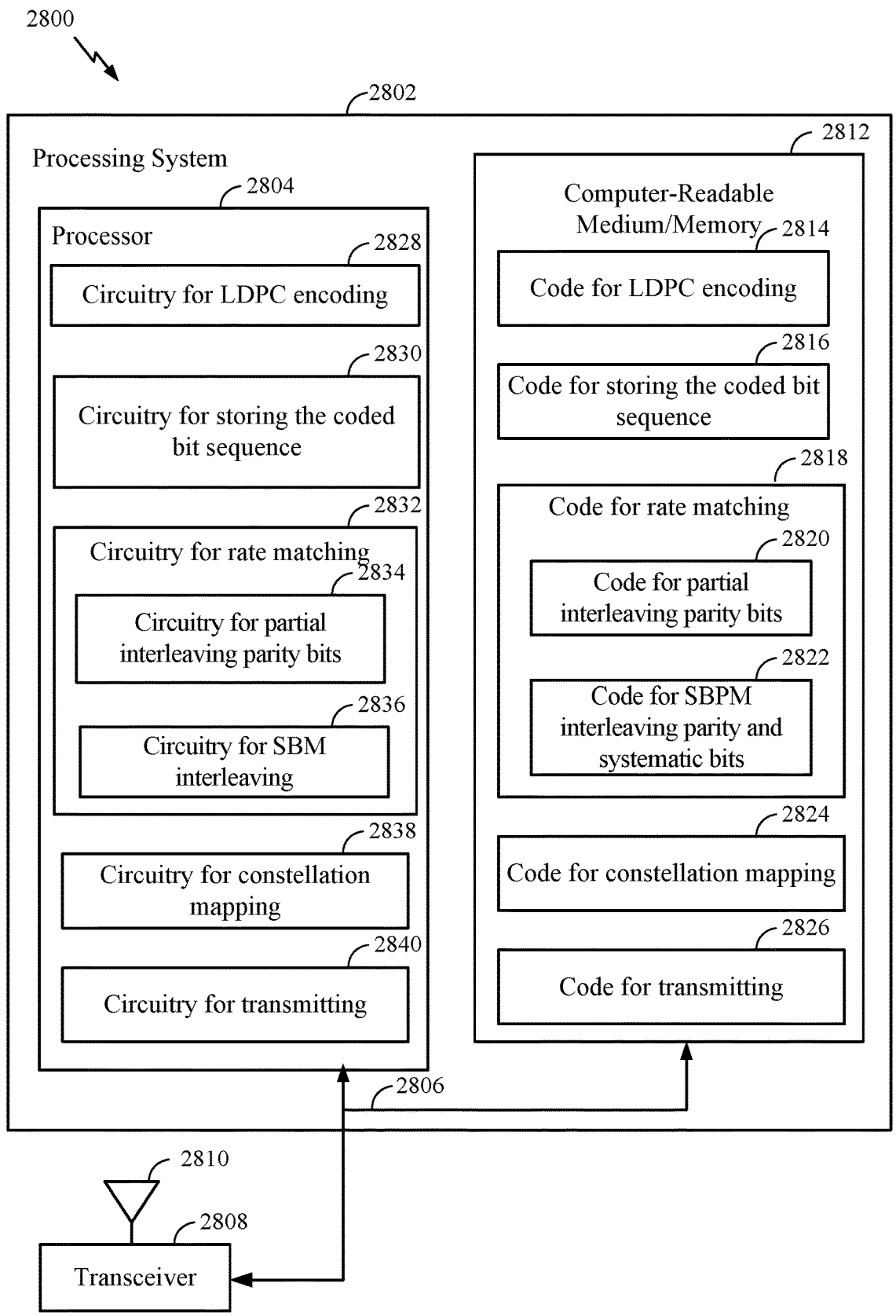
FIG. 28 illustrates a communications device that may include various components configured to perform operations for the techniques disclosed herein in accordance with aspects of the present disclosure.

FIG. 28 illustrates a communications device 2800 that may include various components (e.g., corresponding to means-plus-function components) configured to perform operations for the techniques disclosed herein, such as the operations illustrated in FIG. 24. The communications device 2800 includes a processing system 2802 coupled to a transceiver 2808. The transceiver 2808 is configured to transmit and receive signals for the communications device 2800 via an antenna 2810, such as the various signals as described herein. The processing system 2802 may be configured to perform processing functions for the communications device 2800, including processing signals received and/or to be transmitted by the communications device 2800.

The processing system 2802 includes a processor 2804 coupled to a computer-readable medium/memory 2812 via a bus 2806. In certain aspects, the computer-readable medium/memory 2812 is configured to store instructions (e.g., computer executable code) that when executed by the processor 2804, cause the processor 2804 to perform the operations illustrated in FIG. 24, or other operations for performing the various techniques discussed herein for an LDPC interleaver design for improved error floor. In certain aspects, computer-readable medium/memory 2812 stores code 2814 for LDPC encoding; code 2816 for storing the coded bit sequence; code 2818 for rate matching including code 2820 for partial interleaving parity bits and code 2822 for SBPM interleaving systematic and parity bits; code 2824 for constellation mapping; and code 2826 for transmitting the modulated bit sequence. In certain aspects, the processor 2804 has circuitry configured to implement the code stored in the computer-readable medium/memory 2812. The processor 2804 includes circuitry 2828 for LDPC encoding; circuitry 2830 for storing the coded bit sequence; circuitry 2832 for rate matching including circuitry 2834 for partial interleaving parity bits and circuitry 2836 for SBPM interleaving systematic and parity bits; circuitry 2838 for constellation mapping; and circuitry 2840 for transmitting the modulated bit sequence.

Figure 29:
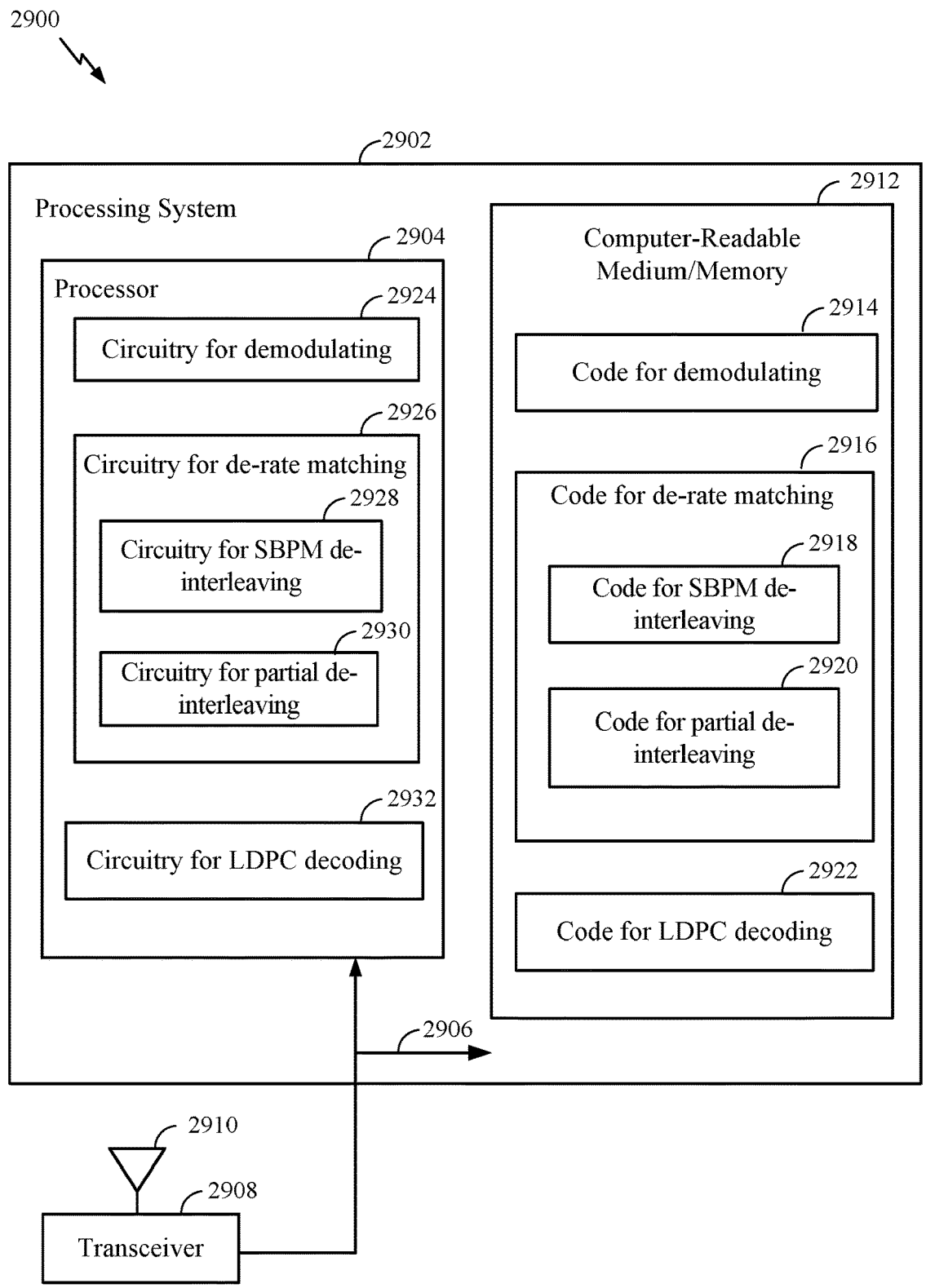
FIG. 29 illustrates a communications device that may include various components configured to perform operations for the techniques disclosed herein in accordance with aspects of the present disclosure.

FIG. 29 illustrates a communications device 2900 that may include various components (e.g., corresponding to means-plus-function components) configured to perform operations for the techniques disclosed herein, such as the operations illustrated in FIG. 25. The communications device 2900 includes a processing system 2902 coupled to a transceiver 2908. The transceiver 2908 is configured to transmit and receive signals for the communications device 2900 via an antenna 2910, such as the various signals as described herein. The processing system 2902 may be configured to perform processing functions for the communications device 2900, including processing signals received and/or to be transmitted by the communications device 2900.

The processing system 2902 includes a processor 2904 coupled to a computer-readable medium/memory 2912 via a bus 2906. In certain aspects, the computer-readable medium/memory 2912 is configured to store instructions (e.g., computer executable code) that when executed by the processor 2904, cause the processor 2904 to perform the operations illustrated in FIG. 25, or other operations for performing the various techniques discussed herein for LDPC interleaver design with improved error floor. In certain aspects, computer-readable medium/memory 2912 stores code 2914 for demodulating; code 2916 for de-rate matching including code 2918 for SBPM de-interleaving systematic and parity bits and code 2920 for partial de-interleaving parity bits; and code 2922 for LDPC decoding. In certain aspects, the processor 2904 has circuitry configured to implement the code stored in the computer-readable medium/memory 2912. The processor 2904 includes circuitry 2924 for demodulating; circuitry 2926 for de-rate matching including circuitry 2928 for SBPM de-interleaving systematic and parity bits and circuitry 2930 for partial de-interleaving parity bits; and circuitry 2932 for LDPC decoding.

Example Aspects

In a first aspect, A method for wireless communications by a transmitting device comprises encoding one or more information bits using a low density parity check (LDPC) code to produce a coded bit sequence comprising systematic bits and parity bits; storing the coded bit sequence in a circular buffer; performing rate matching on the coded bit sequence, wherein the rate matching comprises: interleaving the parity bits with a partial interleaver; and interleaving the systematic bits and the interleaved parity bits with a systematic bit priority mapping (SBPM) interleaver; mapping the SBPM interleaved bit sequence to constellation points according to a modulation scheme to produce a modulated bit sequence; and transmitting the modulated bit sequence.

In a second aspect, alone or in combination with the first aspect, interleaving the parity bits with the partial interleaver comprises randomly interleaving the parity bits or interleaving the parity bits according to a predefined pattern.

In a third aspect, alone in or in combination with one or more of the first and second aspects, interleaving the parity bits with the partial interleaver comprises row-column interleaving the parity bits.

In a fourth aspect, alone in or in combination with one or more of the first through third aspects, interleaving the parity bits with the partial interleaver comprises remapping degree-one parity bits in the bit sequence; and one or more of the degree-one parity bits are remapped to a bit position having a higher reliability than one or more other bits having a higher degree.

In a fifth aspect, alone in or in combination with one or more of the first through fourth aspects, the modulation scheme comprises 16 QAM, 64 QAM, or 56 QAM.

In a sixth aspect, alone in or in combination with one or more of the first through fifth aspects, the method further comprises puncturing one or more systematic bits of the coded bit sequence; and the punctured one or more systematic bits are not stored in the circular buffer.

In a seventh aspect, alone in or in combination with one or more of the first through sixth aspects, the rate matching further comprises performing bit selection from the coded bit sequence stored in the circular buffer.

In an eighth aspect, A method for wireless communications by a receiving device comprises demodulating a received signal corresponding to a coded bit sequence comprising interleaved systematic bits and parity bits; de-rate matching the coded bit sequence, wherein the de-rate matching comprises: de-interleaving the systematic bits and parity bits with a systematic bit priority mapping (SBPM) deinterleaver; and de-interleaving the parity bits with a partial deinterleaver; and decoding the deinterleaved systematic bits and parity bits using a low density parity check (LDPC) code to obtain one or more information bits.

In a ninth aspect, alone or in combination with the eighth aspect, de-interleaving the parity bits with the partial deinterleaver comprises randomly de-interleaving the parity bits or de-interleaving the parity bits according to a predefined pattern.

In a tenth aspect, alone in or in combination with one or more of the eighth and ninth aspects, de-interleaving the parity bits with the partial deinterleaver comprises row-column de-interleaving the parity bits.

In an eleventh aspect, alone in or in combination with one or more of the eighth through tenth aspects, the demodulating comprises 16 QAM, 64 QAM, or 256 QAM demodulation.

In a twelfth aspect, alone in or in combination with one or more of the eighth through eleventh aspects, the method further comprises depuncturing one or more systematic bits of the coded bit sequence.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies.

A UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

In some examples, access to the air interface may be scheduled. A scheduling entity (e.g., a BS) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. BSs are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 24 and FIG. 25.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communications by a transmitting device, comprising:
   encoding one or more information bits using a low density parity check (LDPC) code to produce a coded bit sequence comprising systematic bits and parity bits;
   storing the coded bit sequence in a circular buffer;
   performing rate matching on the coded bit sequence, wherein the rate matching comprises:
      interleaving the parity bits with a partial interleaver; and
      interleaving the systematic bits and the interleaved parity bits with a systematic bit priority mapping (SBPM) interleaver;
   mapping the SBPM interleaved bit sequence to constellation points according to a modulation scheme to produce a modulated bit sequence; and
   transmitting the modulated bit sequence.

2. The method of claim 1, wherein interleaving the parity bits with the partial interleaver comprises randomly interleaving the parity bits or interleaving the parity bits according to a predefined pattern.

3. The method of claim 1, wherein interleaving the parity bits with the partial interleaver comprises row-column interleaving the parity bits.

4. The method of claim 1, wherein:
   interleaving the parity bits with the partial interleaver comprises remapping degree-one parity bits in the bit sequence; and
   one or more of the degree-one parity bits are remapped to a bit position having a higher reliability than one or more other bits having a higher degree.

5. The method of claim 1, wherein the modulation scheme comprises 16 QAM, 64 QAM, or 256 QAM.

6. The method of claim 1, wherein:
   the method further comprises puncturing one or more systematic bits of the coded bit sequence; and
   the punctured one or more systematic bits are not stored in the circular buffer.

7. The method of claim 1, wherein the rate matching further comprises performing bit selection from the coded bit sequence stored in the circular buffer.

8. A method for wireless communications by a receiving device, comprising:
   demodulating a received signal corresponding to a coded bit sequence comprising interleaved systematic bits and parity bits;
   de-rate matching the coded bit sequence, wherein the de-rate matching comprises:
      de-interleaving the systematic bits and parity bits with a systematic bit priority mapping (SBPM) deinterleaver; and
      de-interleaving the parity bits with a partial deinterleaver; and
   decoding the deinterleaved systematic bits and parity bits using a low density parity check (LDPC) code to obtain one or more information bits.

9. The method of claim 8, wherein de-interleaving the parity bits with the partial deinterleaver comprises randomly de-interleaving the parity bits or de-interleaving the parity bits according to a predefined pattern.

10. The method of claim 8, wherein de-interleaving the parity bits with the partial deinterleaver comprises row-column de-interleaving the parity bits.

11. The method of claim 8, wherein the demodulating comprises 16 QAM, 64 QAM, or 256 QAM demodulation.

12. The method of claim 8, further comprising depuncturing one or more systematic bits of the coded bit sequence.

13. An apparatus for wireless communications, comprising:
   means for encoding one or more information bits using a low density parity check (LDPC) code to produce a coded bit sequence comprising systematic bits and parity bits;
   means for storing the coded bit sequence;
   means for performing rate matching on the coded bit sequence, wherein the means rate matching comprises:
      means for partially interleaving the parity bits; and
      means for systematic bit priority mapping (SBPM) interleaving the systematic bits and the interleaved parity bits;
   means for mapping the SBPM interleaved bit sequence to constellation points according to a modulation scheme to produce a modulated bit sequence; and
   means for transmitting the modulated bit sequence.

14. The apparatus of claim 13, wherein the means for partially interleaving the parity bits comprises means for randomly interleaving the parity bits or means for interleaving the parity bits according to a predefined pattern.

15. The apparatus of claim 13, wherein the means for partially interleaving the parity bits comprises means for row-column interleaving the parity bits.

16. The apparatus of claim 13, wherein:
the means for partially interleaving the parity bits comprises means for remapping degree-one parity bits in the bit sequence; and
one or more of the degree-one parity bits are remapped to a bit position having a higher reliability than one or more other bits having a higher degree.

17. The apparatus of claim 13, wherein the modulation scheme comprises 16 QAM, 64 QAM, or 256 QAM.

18. The apparatus of claim 13, wherein:
the apparatus further comprises means for puncturing one or more systematic bits of the coded bit sequence; and
the punctured one or more systematic bits are not stored.

19. The apparatus of claim 13, wherein the means for performing rate matching further comprises means for performing bit selection from the stored coded bit sequence.

20. The apparatus of claim 13, wherein the means for storing the coded bit sequence comprises means for storing the coded bit sequence in a circular buffer.

21. An apparatus for wireless communications, comprising:
means for demodulating a received signal corresponding to a coded bit sequence comprising interleaved systematic bits and parity bits;
means for de-rate matching the coded bit sequence, wherein the means for de-rate matching comprises:
means for systematic bit priority mapping (SBPM) de-interleaving the systematic bits and parity bits; and
means for partially de-interleaving the parity bits; and
means for decoding the deinterleaved systematic bits and parity bits using a low density parity check (LDPC) code to obtain one or more information bits.

22. The apparatus of claim 21, wherein the means for partially de-interleaving the parity bits comprises means for randomly de-interleaving the parity bits or means for de-interleaving the parity bits according to a predefined pattern.

23. The apparatus of claim 21, wherein the means for partially de-interleaving the parity bits comprises means for row-column de-interleaving the parity bits.

24. The apparatus of claim 21, wherein the demodulating comprises 16 QAM, 64 QAM, or 256 QAM demodulation.

25. The apparatus of claim 21, further comprising means for depuncturing one or more systematic bits of the coded bit sequence.

* * * * *